(12) United States Patent
Li et al.

(10) Patent No.: US 12,166,022 B2
(45) Date of Patent: Dec. 10, 2024

(54) DISPLAY DEVICE HAVING A BANK AND MANUFACTURING METHOD THEREOF

(71) Applicant: Samsung Display Co., Ltd., Yongin-si (KR)

(72) Inventors: Xinxing Li, Yongin-si (KR); Tae Jin Kong, Yongin-si (KR); Hee Keun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 567 days.

(21) Appl. No.: 17/299,716

(22) PCT Filed: Jun. 5, 2019

(86) PCT No.: PCT/KR2019/006831
§ 371 (c)(1),
(2) Date: Jun. 3, 2021

(87) PCT Pub. No.: WO2020/116732
PCT Pub. Date: Jun. 11, 2020

(65) Prior Publication Data
US 2022/0052032 A1    Feb. 17, 2022

(30) Foreign Application Priority Data

Dec. 7, 2018   (KR) ........................ 10-2018-0157109

(51) Int. Cl.
*H01L 33/36*     (2010.01)
*H01L 21/467*     (2006.01)
(Continued)

(52) U.S. Cl.
CPC .......... *H01L 25/167* (2013.01); *H01L 21/467* (2013.01); *H01L 27/1288* (2013.01)

(58) Field of Classification Search
CPC ......... H01L 33/36; H01L 33/38; H01L 33/44; H01L 33/48; H01L 25/167; H01L 27/1288
See application file for complete search history.

(56) References Cited

U.S. PATENT DOCUMENTS 8,729,550 B2    5/2014   Yamazaki et al.
9,318,475 B2    4/2016   Bibl et al.
(Continued)

FOREIGN PATENT DOCUMENTS

JP     2012114159 A   *   6/2012
KR    10-0527190 B1     11/2005
(Continued)

OTHER PUBLICATIONS

"Circuit." Merriam-Webster.com. https://www.merriam-webster.com/dictionary/circuit. Mar. 27, 2024. (Year: 2024).*
(Continued)

*Primary Examiner* — Reema Patel
(74) *Attorney, Agent, or Firm* — Lewis Roca Rothgerber Christie LLP

(57) ABSTRACT

A display device may include a pixel circuit layer. A first electrode and a second electrode may be on the pixel circuit layer and spaced from each other. A first insulating layer may be on the pixel circuit layer, the first electrode, and the second electrode. A conductive pattern may be on the first insulating layer and electrically insulated from the first electrode and the second electrode. The bank may be on the conductive pattern. Light emitting elements may be located on the first insulating layer between the first electrode and the second electrode, and electrically coupled to the first electrode and the second electrode.

18 Claims, 25 Drawing Sheets

(51) Int. Cl.
*H01L 25/16* (2023.01)
*H01L 27/12* (2006.01)

(56) References Cited

U.S. PATENT DOCUMENTS

| | | |
|---|---|---|
| 10,115,767 B2 | 10/2018 | Kwon |
| 2005/0070054 A1* | 3/2005 | Hotta ............... H01L 27/124 |
| | | 257/E27.111 |
| 2005/0142977 A1 | 6/2005 | Park |
| 2009/0153033 A1 | 6/2009 | Lee et al. |
| 2010/0133993 A1 | 6/2010 | Pang |
| 2012/0104399 A1 | 5/2012 | Choi et al. |
| 2012/0292162 A1* | 11/2012 | Jeong ............... B82Y 10/00 |
| | | 977/890 |
| 2014/0367705 A1 | 12/2014 | Bibl et al. |
| 2015/0333221 A1 | 11/2015 | Bibl et al. |
| 2017/0294480 A1 | 10/2017 | Kwon |
| 2018/0019369 A1 | 1/2018 | Cho et al. |
| 2018/0175106 A1 | 6/2018 | Kim et al. |
| 2018/0226461 A1 | 8/2018 | Adachi et al. |

FOREIGN PATENT DOCUMENTS

| | | |
|---|---|---|
| KR | 10-2007-0081900 A | 8/2007 |
| KR | 10-2009-0062088 A | 6/2009 |
| KR | 10-1354434 B1 | 1/2014 |
| KR | 10-2014-0017854 A | 2/2014 |
| KR | 10-2015-0125207 A | 11/2015 |
| KR | 10-2017-0116631 A | 10/2017 |
| KR | 10-2018-0055021 A | 5/2018 |
| KR | 10-2018-0071402 A | 6/2018 |
| KR | 10-2020-0027136 A | 3/2020 |

OTHER PUBLICATIONS

International Search Report for corresponding Application No. PCT/KR2019/006831 dated Sep. 11, 2019, 6pp.

Chinese Office Action dated Feb. 6, 2024 regarding Chinese Patent Application No. 201980080999.6 corresponding to U.S. Appl. No. 17/299,716 (7 pages).

Korean Notice of Allowance dated Feb. 8, 2024 regarding Japanese Patent Application No. 10-2018-0157109 corresponding to U.S. Appl. No. 17/299,716 (6 pages).

* cited by examiner

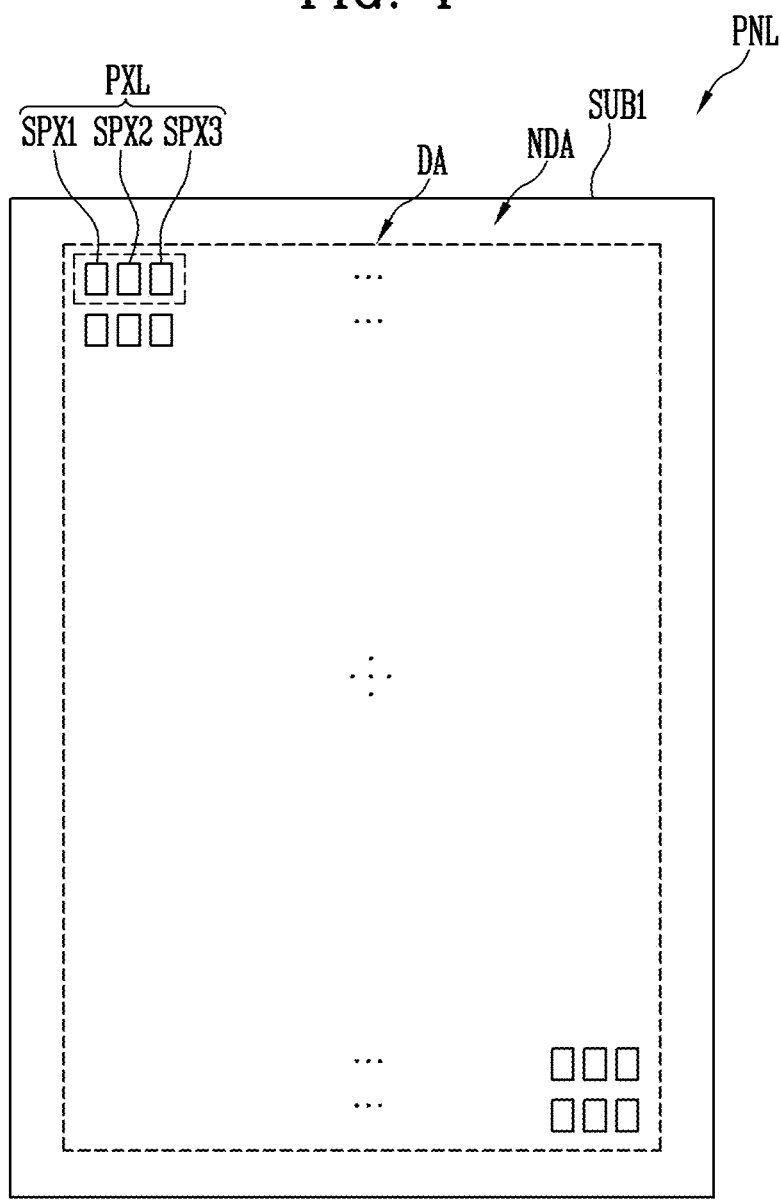

DISPLAY DEVICE HAVING A BANK AND MANUFACTURING METHOD THEREOF

CROSS-REFERENCE TO RELATED APPLICATIONS

This application is a U.S. National Phase Patent Application of International Patent Application Number PCT/KR2019/006831, filed on Jun. 5, 2019, which claims priority to Korean Patent Application Number 10-2018-0157109, filed on Dec. 7, 2018, the entire contents of all of which are incorporated herein by reference.

TECHNICAL BACKGROUND

1. Field

Various embodiments of the present disclosure relate to a display device and a method of fabricating the display device.

2. Background Art

Recently, techniques for manufacturing a subminiature light emitting element using a material having a reliable inorganic crystal structure and manufacturing a light emitting device using the light emitting element have been developed. For example, techniques for configuring a light source of a light emitting device using subminiature light emitting elements having a small size corresponding to a range from a nanoscale size to a microscale size have been developed. Such a light emitting device may be used in various electronic devices such as a display device and a lighting device.

SUMMARY

Light emitting elements may be supplied onto a substrate through an inkjet scheme or the like, and the light emitting elements supplied to respective emission areas may not be mixed with each other by a bank provided to define the respective emission areas to which the light emitting elements are supplied.

Various embodiments of the present disclosure are directed to a display device including a bank having enhanced characteristics.

Various embodiments of the present disclosure are directed to a method of fabricating a display device including a bank through a simpler process.

According to an aspect of an embodiment of the present disclosure, a display device may include: a pixel circuit layer; a first electrode and a second electrode on the pixel circuit layer and spaced from each other; a first insulating layer on the pixel circuit layer, the first electrode, and the second electrode; a conductive pattern on the first insulating layer and electrically insulated from the first electrode and the second electrode; a bank on the conductive pattern; and light emitting elements located on the first insulating layer between the first electrode and the second electrode, and electrically coupled to the first electrode and the second electrode.

In an embodiment, an angle between a sidewall of the bank and an upper surface of the first insulating layer may be in a range of 70° to 90°.

In an embodiment, the bank may completely overlap the conductive pattern, and the sidewall of the bank may be located in a same plane as a sidewall of the conductive pattern.

In an embodiment, the bank may include, at a boundary surface thereof bordering the conductive pattern, a concave groove in the sidewall thereof. A portion of the bank that is adjacent to the boundary surface may have a reverse tapered shape.

In an embodiment, the bank may overlap the conductive pattern. A first width of the bank may be greater than a second width of the conductive pattern on a boundary surface between the bank and the conductive pattern.

In an embodiment, a portion of the conductive pattern including conductive material has been removed by wet-etching.

In an embodiment, the conductive pattern may include transparent conductive material.

In an embodiment, the bank may include light shielding material to block light that is incident from the light emitting elements.

In an embodiment, the display device may further include: a first bank pattern interposed between the first electrode and the pixel circuit layer; and a second bank pattern interposed between the second electrode and the pixel circuit layer. The light emitting elements may be located between the first bank pattern and the second bank pattern. A thickness of the bank may be greater than a thickness of the first bank pattern.

In an embodiment, the conductive pattern may not overlap the first bank pattern and the second bank pattern.

In an embodiment, the display device may further include: a first contact electrode located on a first end of the light emitting elements and one area of the first electrode, and configured to electrically connect the first end to the first electrode; and a second contact electrode located on a second end of the light emitting elements and one area of the second electrode, and configured to electrically connect the second end to the second electrode.

In an embodiment, at least a portion of the conductive pattern, at least a portion of the first contact electrode, and at least a portion of the second contact electrode may be located on a same plane.

In an embodiment, a thickness of the conductive pattern may differ from a thickness of the first contact electrode.

In an embodiment, the pixel circuit layer may include a first emission area, a second emission area, and a third emission area that are separated from each other by the bank. The light emitting elements may include a first light emitting element in the first emission area, a second light emitting element in the second emission area, and a third light emitting element in the third emission area. The first light emitting element, the second light emitting element, and the third light emitting element may emit different colors of light.

In an embodiment, each of the light emitting elements may include a rod-shaped light emitting diode having a size ranging from a nanometer scale to a micrometer scale.

According to an aspect of an embodiment of the present disclosure, a display device may include: a pixel circuit layer; a first electrode and a second electrode on the pixel circuit layer and spaced from each other; a first insulating layer on the pixel circuit layer, the first electrode, and the second electrode; a bank on the first insulating layer; a conductive pattern overlapping the bank and electrically insulated from the first electrode and the second electrode; and light emitting elements located on the first insulating layer between the first electrode and the second electrode, and electrically coupled to the first electrode and the second electrode.

According to an aspect of an embodiment of the present disclosure, a method of fabricating a display device may include: forming a first electrode and a second electrode that are spaced from each other on a pixel circuit layer; forming a first insulating layer on the pixel circuit layer, the first electrode, and the second electrode; forming a light shielding layer on the first insulating layer; patterning a mask on the light shielding layer; and forming a bank by etching the light shielding layer exposed from the mask.

In an embodiment, forming the light shielding layer on the first insulating layer may include: forming a conductive layer on the first insulating layer; and forming the light shielding layer on the conductive layer.

In an embodiment, forming the bank may include: dry-etching the light shielding layer exposed from the mask; and wet-etching a portion of the conductive layer that is exposed from the mask, and the mask.

In an embodiment, the mask and the conductive layer may include an identical material.

In a display device and a method of fabricating the display device in accordance with an embodiment of the present disclosure, a bank may be formed through a dry-etching process, so that the bank having a desired etch profile angle and a desired thickness can be formed (e.g., formed with relative ease).

Furthermore, in a display device and a method of fabricating the display device in accordance with an embodiment of the present disclosure, a conductive pattern (or a conductive layer) is formed under the bank, so that during the dry-etching process, a lower structure (e.g., a first insulating layer, and first and second electrodes) may be prevented from being damaged, and residues of the bank may be removed. Therefore, defects resulting from the residues (e.g., a short-circuit defect, or alignment defects of the light emitting elements attributable to the residues) may be prevented from occurring.

BRIEF DESCRIPTION OF THE DRAWINGS

FIG. 4 is a plan view illustrating a display device in accordance with an embodiment of the present disclosure.

DETAILED DESCRIPTION

Figure 1A:
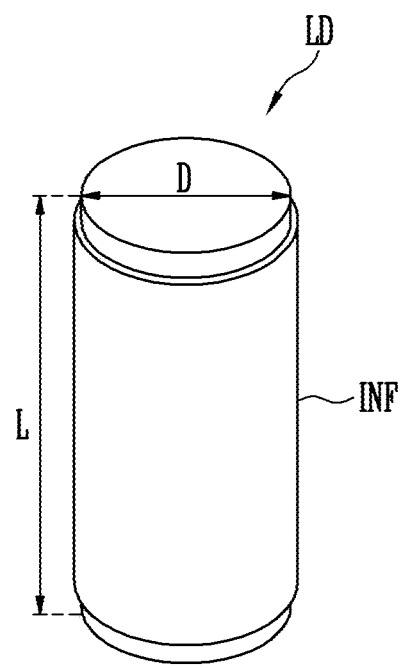
FIGS. 1A and 1B are respectively a perspective view and a sectional view illustrating a light emitting element in accordance with an embodiment of the present disclosure.

Reference will now be made in detail to various embodiments of the present disclosure, specific examples of which are illustrated in the accompanying drawings and described below, because the embodiments of the present disclosure can be variously modified in many different forms. However, the present disclosure is not limited to the following embodiments and may be modified into various forms.

Some elements which are not directly related to the features of the present disclosure in the drawings may be omitted to clearly explain the present disclosure. Furthermore, the sizes, ratios, etc. of some elements in the drawings may be slightly exaggerated. It should be noted that the same reference numerals are used to designate the same or similar elements throughout the drawings, and repetitive explanation may be omitted.

It will be understood that, although the terms "first", "second", etc. may be used herein to describe various elements, these elements should not be limited by these terms. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. Furthermore, the term "position", "direction", etc. used in the following description are defined in relative terms, and it should be noted that they may be changed into a reverse position or direction depending on a view angle or direction.

Embodiments and required details of the present disclosure are described with reference to the accompanying drawings in order to describe the present disclosure in detail so that those having ordinary skill in the technical field to which the present disclosure pertains can practice the present disclosure without undue experimentation. Furthermore, a singular form may include a plural from as long as only the singular form is clearly included based on the context of the description.

Figure 1B:
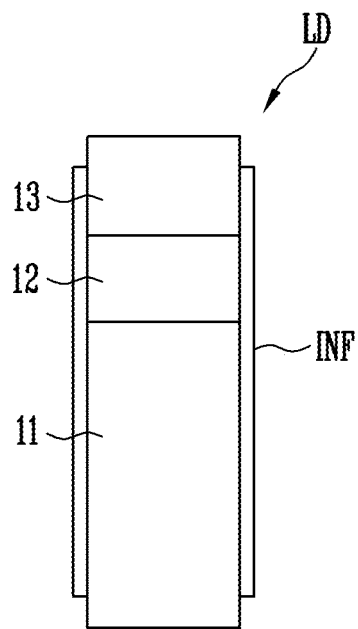

FIGS. 1A and 1B are respectively a perspective view and a sectional view illustrating a light emitting element in accordance with an embodiment of the present disclosure. Although a rod-type light emitting element LD of a cylindrical shape is illustrated in FIGS. 1A and 1B, the type and/or shape of the light emitting element LD according to the present disclosure are not limited thereto.

Referring to FIGS. 1A and 1B, the light emitting element LD may include a first conductive semiconductor layer 11, a second conductive semiconductor layer 13, and an active layer 12 interposed between the first and second conductive semiconductor layers 11 and 13. For example, the light emitting element LD may be configured of a stacked body formed by successively stacking the first conductive semiconductor layer 11, the active layer 12, and the second conductive semiconductor layer 13 in one direction.

In an embodiment, the light emitting element LD may be provided in the form of a rod extending in one direction. The light emitting element LD may have a first end and a second end with respect to one direction.

In an embodiment, one of the first and second conductive semiconductor layers 11 and 13 may be disposed on the first end of the light emitting element LD, and the other one of the first and second conductive semiconductor layers 11 and 13 may be disposed on the second end of the light emitting element LD.

In an embodiment, the light emitting element LD may be a rod-type light emitting diode manufactured in the form of a rod. Here, the term "rod-like shape" embraces a rod-like shape and a bar-like shape such as a cylindrical shape and a prismatic shape that is longer in a longitudinal direction than in a width direction (i.e., to have an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size corresponding to the nanometer scale or the micrometer scale, e.g., a diameter D and/or a length L corresponding to the nanometer scale or the micrometer scale. However, the size of the light emitting element LD is not limited to this. For example, the size of the light emitting element LD may be changed in various ways depending on design conditions of various devices, e.g., a display device, which employs, as a light source, a light emitting device using a light emitting element LD.

The first conductive semiconductor layer 11 may include at least one n-type semiconductor layer. For instance, the first conductive semiconductor layer 11 may include an n-type semiconductor layer which includes one semiconductor material of InAlGaN, GaN, AlGaN, InGaN, AlN, and InN, and is doped with a first conductive dopant such as Si, Ge, or Sn. However, the material for forming the first conductive semiconductor layer 11 is not limited to this, and the first conductive semiconductor layer 11 may be formed of various other materials.

The active layer 12 may be disposed on the first conductive semiconductor layer 11 and have a single or multiple quantum well structure. In an embodiment, a cladding layer doped with a conductive dopant may be formed over and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field of a suitable voltage (e.g., a set or predetermined voltage) or more is applied between the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source of various light emitting devices as well as a pixel of the display device.

The second conductive semiconductor layer 13 may be disposed on the active layer 12 and include a semiconductor layer of a type different from that of the first conductive semiconductor layer 11. For example, the second conductive semiconductor layer 13 may include at least one p-type semiconductor layer. For instance, the second conductive semiconductor layer 13 may include a p-type semiconductor layer which includes any one semiconductor material of InAlGaN, GaN, AlGaN, InGaN, AlN, and InN, and is doped with a second conductive dopant such as Mg. However, the material for forming the second conductive semiconductor layer 13 is not limited to this, and the second conductive semiconductor layer 13 may be formed of various other materials.

In an embodiment, the light emitting element LD may further include an insulating film INF provided on the surface of the light emitting element LD. The insulating film INF may be formed on the surface (e.g., an outer peripheral surface) of the light emitting element LD to enclose an outer peripheral surface (e.g., an outer circumferential surface) of at least the active layer 12, and may further enclose one area of each of the first and second conductive semiconductor layers 11 and 13. Here, the insulating film INF may allow the opposite ends of the light emitting element LD that have different polarities to be exposed to the outside. For example, the insulating film INF may expose one end of each of the first and second conductive semiconductor layers 11 and 13 that are disposed on the respective opposite ends of the light emitting element LD with respect to the longitudinal direction, e.g., may expose two surfaces (i.e. top and bottom surfaces) of the cylinder rather than covering them.

In an embodiment, the insulating film INF may include at least one insulating material of $SiO_2$, $Si_3N_4$, $Al_2O_3$, and $TiO_2$, but it is not limited thereto. In other words, the material that forms the insulating film INF is not limited to a particular material, and the insulating film INF may be formed of well-known various insulating materials.

In an embodiment, the light emitting element LD may further include additional other components as well as the first conductive semiconductor layer 11, the active layer 12, the second conductive semiconductor layer 13, and/or the insulating film INF. For example, the light emitting element LD may further include one or more fluorescent layers, one or more active layers, one or more semiconductor layers, and/or one or more electrode layers disposed on one end of the first conductive semiconductor layer 11, the active layer 12, and/or the second conductive semiconductor layer 13.

Figure 2A:
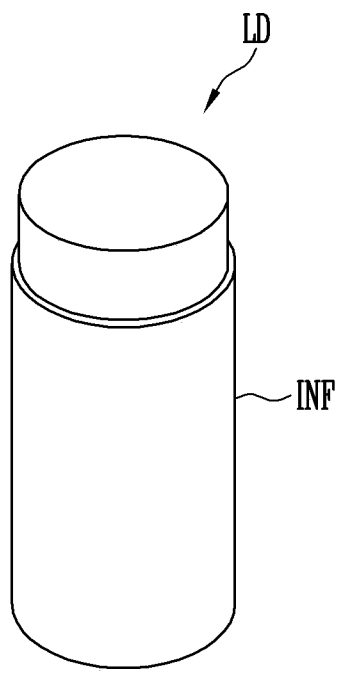
FIGS. 2A and 2B are respectively a perspective view and a sectional view illustrating a light emitting element in accordance with an embodiment of the present disclosure.
Figure 2B:
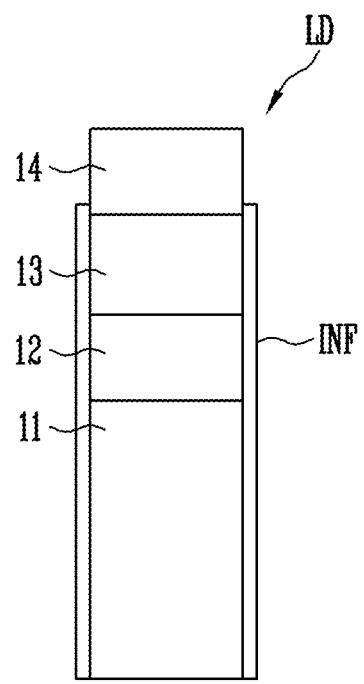
Figure 3A:
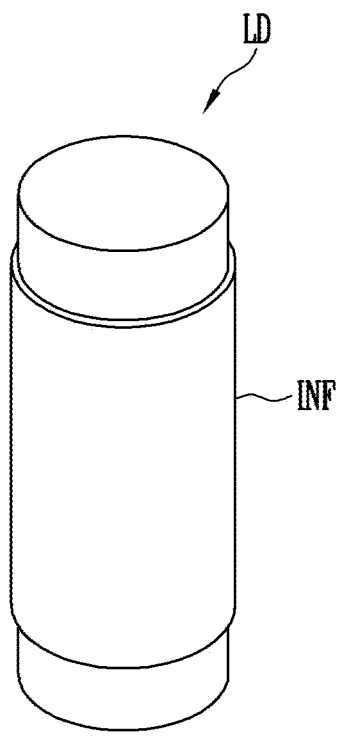
FIGS. 3A and 3B are respectively a perspective view and a sectional view illustrating a light emitting element in accordance with an embodiment of the present disclosure.
Figure 3B:
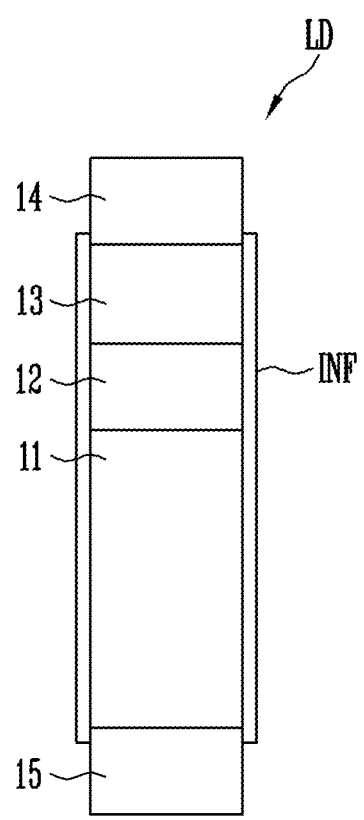

FIGS. 2A and 2B are respectively a perspective view and a sectional view illustrating a light emitting element in accordance with an embodiment of the present disclosure. FIGS. 3A and 3B are respectively a perspective view and a sectional view illustrating a light emitting element in accordance with an embodiment of the present disclosure.

Referring to FIGS. 2A and 2B, the light emitting element LD may further include at least one electrode layer 14 disposed on one end of the second conductive semiconductor layer 13.

Referring to FIGS. 3A and 3B, the light emitting element LD may further include at least one electrode layer 15 disposed on one end of the first conductive semiconductor layer 11.

Each of the electrode layers 14 and 15 may be an ohmic contact electrode, but it is not limited thereto. Furthermore, each of the electrode layers 14 and 15 may include metal or conductive metal oxide, and for example, may be formed of Cr, Ti, Al, Au, Ni, and an oxide or alloy thereof, ITO, IZO, and ITZO may be used alone or in combination with each other. The electrode layers 14 and 15 may be substantially transparent or semitransparent. Thereby, light generated from the light emitting element LD may be emitted to the outside after passing through the electrode layers 14 and 15.

In an embodiment, the insulating film INF may at least partially enclose the outer peripheral surfaces (e.g., outer circumferential surfaces) of the electrode layers 14 and 15, or may not enclose the outer peripheral surfaces (e.g., outer circumferential surfaces) of the electrode layers 14 and 15. In other words, the insulating film INF may be selectively formed on the surfaces of the electrode layers 14 and 15. Furthermore, the insulating film INF may be formed to expose the opposite ends of the light emitting element LD that have different polarities, for example, may expose at least an area of each of the electrode layers 14 and 15. However, in some embodiments, the insulating film INF may not be provided.

If the insulating film INF is provided on the surface of the light emitting element LD, for example, on the surface of the active layer 12, the active layer 12 may be prevented from short-circuiting with at least one electrode, e.g., at least one contact electrode of contact electrodes coupled to the opposite ends of the light emitting element LD, etc. Consequently, the electrical stability of the light emitting element LD may be secured.

Furthermore, the insulating film INF may be formed on the surface of the light emitting element LD, thus reducing or minimizing surface defects of the light emitting element LD and improving the lifespan and efficiency of the light emitting element LD. Moreover, the insulating film INF is formed on the light emitting element LD, thus preventing an undesired short circuit between the light emitting elements LD from occurring even if multiple light emitting elements LD are disposed in close proximity to each other.

In an embodiment, the light emitting element LD may be manufactured through a surface treatment process (e.g. coating). For example, when the plurality of light emitting elements LD is mixed with fluid solution to be supplied to each emission area (e.g. an emission area of each pixel), the light emitting elements LD may be uniformly dispersed without being non-uniformly aggregated in the solution. Here, the emission area is an area in which light is emitted by the light emitting elements LD. The emission area may be distinguished from a non-emission area in which light is not emitted.

A light emitting device including the light emitting element LD described above may be used in various devices including a display device which requires a light source. For example, a plurality of subminiature light emitting elements LD may be disposed in each pixel area of a display panel, thereby forming a light emitting unit of each pixel. Furthermore, the field of application of the light emitting element LD according to the present disclosure is not limited to a display device. For example, the light emitting element LD may also be used in various devices such as a lighting device, which requires a light source.

FIG. 4 is a plan view illustrating a display device in accordance with an embodiment of the present disclosure. In an embodiment, FIG. 4 illustrates a display device, for example, a display panel PNL provided in the display device, as an example of a device which may use, as a light source, the light emitting elements LD described with reference to FIGS. 1A-3B. FIG. 4 illustrates the structure of the display panel PNL, focused on a display area DA. In some embodiments, at least one driving circuit component (e.g., at least one of a scan driver and a data driver) and/or a plurality of lines may be further provided on the display panel PNL.

Referring to FIG. 4, the display panel PNL may include a base layer SUB1 (or substrate), and a pixel PXL disposed on the base layer SUB1. In some embodiments, the display panel PNL and the base layer SUB1 may include a display area DA configured to display an image, and a non-display area NDA formed in an area (e.g., a set or predetermined area) other than the display area DA.

In an embodiment, the display area DA may be disposed in a central area of the display panel PNL, and the non-display area NDA may be disposed along a perimeter of the display panel PNL in such a way as to enclose the display area DA. The locations of the display area DA and the non-display area NDA are not limited to this, and the locations thereof may be changed.

The base layer SUB1 may form a base of the display panel PNL. For example, the base layer SUB1 may form a base of a lower panel (e.g., a lower plate of the display panel PNL).

In an embodiment, the base layer SUB1 may be a rigid or flexible substrate, and the material or properties thereof are not particularly limited. For example, the base layer SUB1 may be a rigid substrate made of glass or reinforced glass, or a flexible substrate formed of a thin film made of plastic or metal. Furthermore, the base layer SUB1 may be a transparent substrate, but it is not limited thereto. For instance, the base layer SUB1 may be a translucent substrate, an opaque substrate, or a reflective substrate.

An area on the base layer SUB1 is defined as the display area DA in which the pixels PXL are disposed, and the other area thereof is defined as the non-display area NDA. For example, the base layer SUB1 may include the display area DA including a plurality of pixel areas on which the pixels PXL are formed, and the non-display area NDA disposed around the display area DA. Various lines and/or internal circuits which are coupled to the pixels PXL of the display area DA may be disposed in the non-display area NDA.

The pixel PXL may include at least one light emitting element LD (e.g., at least one rod-type light emitting diode according to any one of the embodiments shown in FIGS. 1A-3B) that is driven by a corresponding scan signal and a corresponding data signal. For example, the pixel PXL may include a plurality of rod-type light emitting diodes, each of which has a small size ranging from the nanometer scale to the micrometer scale, that are coupled in parallel to each other. The plurality of rod-type light emitting diodes may form a light source of each pixel PXL.

Furthermore, the pixel PXL may include a plurality of sub-pixels. For example, the pixel PXL may include a first sub-pixel SPX1, a second sub-pixel SPX2, and a third sub-pixel SPX3. In an embodiment, the first, second, and third sub-pixels SPX1, SPX2, and SPX3 may emit different colors of light. For instance, the first sub-pixel SPX1 may be a red sub-pixel for emitting red light, the second sub-pixel SPX2 may be a green sub-pixel for emitting green light, and the third sub-pixel SPX3 may be a blue sub-pixel for emitting blue light. However, the colors, types and/or number of sub-pixels forming each pixel PXL are not particularly limited. For example, the color of light which is emitted from each sub-pixel may be changed in various ways. Although in FIG. 4 there is illustrated an embodiment where the pixels PXL are arranged in the display area DA in a stripe shape, the present disclosure is not limited thereto. For example, the pixels PXL may be arranged in various pixel array forms that are known.

In an embodiment, the pixel PXL (or each of the sub-pixels) may be formed of an active pixel. However, the type, structure, and/or driving scheme of the pixel PXL capable of being applied to the display device according to the present disclosure are not particularly limited. For example, the pixel PXL may be formed of a pixel of a light emitting display device which has various well-known active and/or passive structures.

Figure 5A:
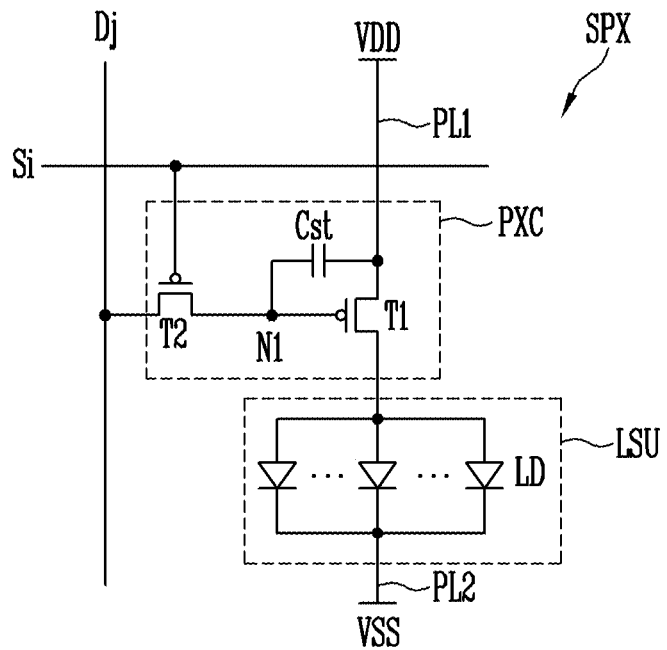
FIGS. 5A-5C are circuit diagrams illustrating examples of a sub-pixel included in the display device of FIG. 4.
Figure 5B:
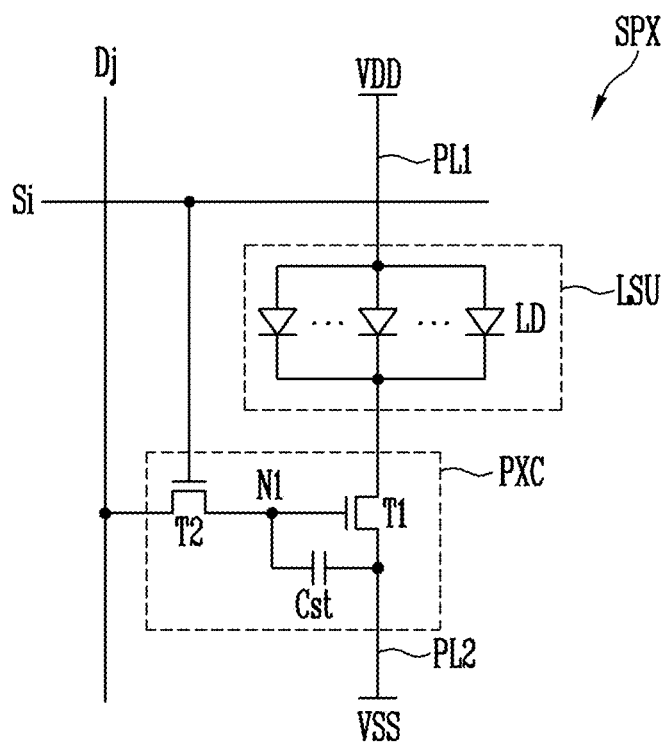
Figure 5C:
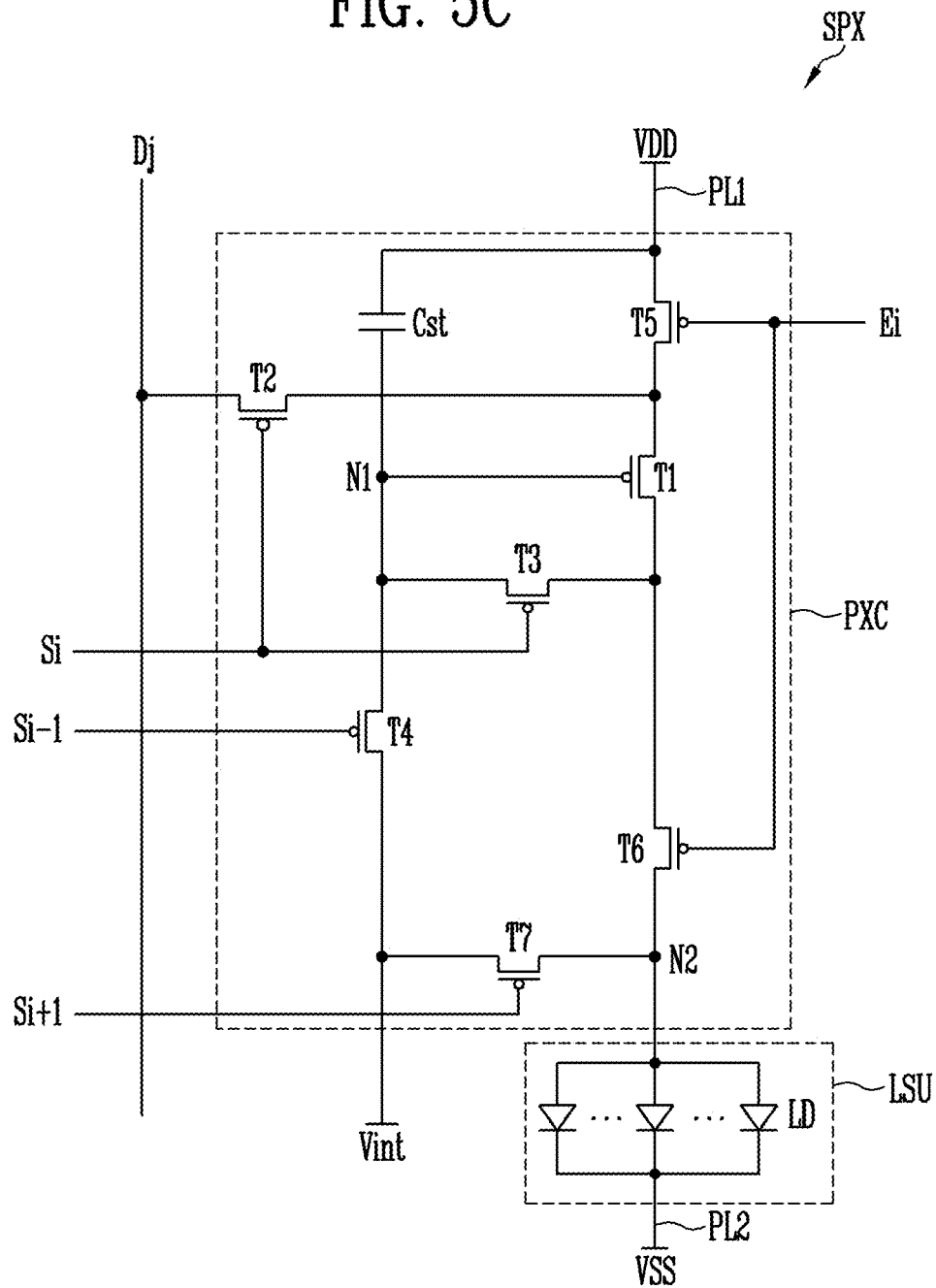

FIGS. 5A-5C are circuit diagrams illustrating examples of a sub-pixel included in the display device of FIG. 4. FIGS. 5A-5C each illustrate any one of the first, second, and third sub-pixels SPX1, SPX2, and SPX3 illustrated in FIG. 4. FIGS. 5A-5C illustrate different embodiments of a sub-pixel SPX which can be provided in an active display device (e.g., an active light emitting display device).

For example, the sub-pixel SPX shown in each of FIGS. 5A-5C may be any one of the first, second, and third sub-pixels SPX1, SPX2, and SPX3 provided in the light emitting display panel PNL of FIG. 4. The structures of the first, second, and third sub-pixels SPX1, SPX2, and SPX3 may be substantially identical or similar to each other. Therefore, in FIGS. 5A-5C, the first, second, and third sub-pixels SPX1, SPX2, and SPX3 will be collectively referred to as a sub-pixel SPX.

Referring to FIG. 5A, the sub-pixel SPX may include a light emitting unit LSU, and a pixel circuit PXC configured to drive the light emitting unit LSU.

In an embodiment, the light emitting unit LSU may include a plurality of light emitting elements LD coupled parallel to each other between first and second power supplies VDD and VSS. The first and second power supplies VDD and VSS may have different potentials. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during at least an emission period of the sub-pixel SPX.

Although FIG. 5A illustrates that the light emitting elements LD are coupled in parallel in the same direction (e.g., in a forward direction) between the first power supply VDD and the second power supply VSS, the present disclosure is not limited to this. For example, some of the light emitting elements LD may be coupled to each other in the forward direction between the first and second power supplies VDD and VSS, and the other light emitting elements LD may be coupled to each other in the reverse direction. In an embodiment, at least one sub-pixel SPX may include only a single light emitting element LD.

In an embodiment, the respective first ends of the light emitting elements LD may be coupled in common to the corresponding pixel circuit PXC through a first electrode, and may be coupled to the first power supply VDD through the pixel circuit PXC. The respective second ends of the light emitting elements LD may be coupled in common to the second power supply VSS through a second electrode.

The light emitting unit LSU may emit light having a luminance corresponding to driving current supplied thereto through the corresponding pixel circuit PXC. Thereby, an image (e.g., a set or predetermined image) may be displayed on the display area DA.

The pixel circuit PXC may be coupled to a scan line Si and a data line Dj of the corresponding sub-pixel SPX. For example, if the sub-pixel SPX is disposed on an i-th row and a j-th column of the display area DA, the pixel circuit PXC of the sub-pixel SPX may be coupled to the i-th scan line Si and the j-th data line Dj of the display area DA. The pixel circuit PXC may include first and second transistors T1 and T2, and a storage capacitor Cst.

The first transistor (or driving transistor) T1 may be coupled between the first power supply VDD and the first electrode of the light emitting unit LSU. A gate electrode of the first transistor T1 is coupled to a first node N1. The first transistor T1 may control driving current to be supplied to the light emitting unit LSU in response to a voltage at the first node N1.

The second transistor (or switching transistor) T2 may be coupled between the data line Dj and the first node N1. A gate electrode of the second transistor T2 may be coupled to the scan line Si.

When a scan signal having a gate-on voltage (e.g., a low voltage) is supplied from the scan line Si, the second transistor T2 may be turned on to electrically couple the first node N1 to the data line Dj. During each frame period, a data signal of a corresponding frame is supplied to the data line Dj. The data signal may be transmitted to the first node N1 via the second transistor T2. Thereby, a voltage corresponding to the data signal may be charged to the storage capacitor Cst (e.g., the capacitor Cst may hold a charge corresponding to the data signal of that frame period).

The first electrode of the storage capacitor Cst may be coupled to the first power supply VDD, and the second electrode thereof may be coupled to the first node N1. The storage capacitor Cst may charge voltage (or hold a charge) corresponding to a data signal supplied to the first node N1 during each frame period, and maintain the charged voltage until a data signal of a subsequent frame is supplied.

Although FIG. 5A illustrates that all of the transistors, e.g., the first and second transistors T1 and T2, included in the pixel circuit PXC are P-type transistors, the present disclosure is not limited to this. In other words, at least one of the first and second transistors T1 and T2 may be changed to an N-type transistor.

For example, as shown in FIG. 5B, both the first and second transistors T1 and T2 may be formed of N-type transistors. The configuration and operation of the sub-pixel SPX shown in FIG. 5B, other than the fact that connection positions of some circuit elements have been changed depending on a change in type of the transistors together with corresponding changes to voltage levels of applied power and signals, may be substantially similar to those of the sub-pixel SPX of FIG. 5A. Therefore, detailed description of the sub-pixel SPX of FIG. 5B will be omitted.

The structure of the pixel circuit PXC is not limited to the embodiments shown in FIGS. 5A and 5B. In other words, the pixel circuit PXC may be formed of a well-known pixel circuit which may have various structures and/or be operated by various driving schemes. For example, the pixel circuit PXC may be configured in the same manner as that of an embodiment illustrated in FIG. 5C.

Referring to FIG. 5C, the pixel circuit PXC may be coupled not only to a scan line Si of a corresponding horizontal line but also to at least one another scan line (or a control line). For example, the pixel circuit PXC of the sub-pixel SPX disposed on the i-th row of the display area DA may be further coupled to an i−1-th scan line Si−1 and/or an i+1-th scan line Si+1. In an embodiment, the pixel circuit PXC may be coupled not only to the first and second power supplies VDD and VSS but also to other power supplies. For instance, the pixel circuit PXC may also be coupled to an initialization power supply Vint. In an embodiment, the pixel circuit PXC may include first to seventh transistors T1 to T7 and a storage capacitor Cst.

The first transistor T1 is coupled between the first power supply VDD and the first electrode of the light emitting unit LSU. A gate electrode of the first transistor T1 may be coupled to a first node N1. The first transistor T1 may control driving current to be supplied to the light emitting unit LSU in response to a voltage at the first node N1.

The second transistor T2 may be coupled between the data line Dj and the first electrode of the first transistor T1. The gate electrode of the second transistor T2 may be coupled to the corresponding scan line Si. When a scan signal having a gate-on voltage (e.g., a low voltage) is supplied from the scan line Si, the second transistor T2 may be turned on to electrically couple the data line Dj to the first electrode of the first transistor T1. Hence, if the second transistor T2 is turned on, a data signal supplied from the data line Dj may be transmitted to the first transistor T1.

The third transistor T3 may be coupled between the second electrode of the first transistor T1 and the first node N1. The gate electrode of the third transistor T3 may be coupled to the corresponding scan line Si. When a scan signal of a gate-on voltage (e.g., a low voltage) is supplied from the scan line Si, the third transistor T3 may be turned on to connect the first transistor T1 in the form of a diode (e.g., the first transistor T1 is diode-connected).

The fourth transistor T4 may be coupled between the first node N1 and an initialization power supply Vint. A gate electrode of the fourth transistor T4 may be coupled to a preceding scan line, e.g., an i−1-th scan line Si−1. When a scan signal of a gate-on voltage (e.g., a low voltage) is supplied to the i−1-th scan line Si−1, the fourth transistor T4 may be turned on so that the voltage of the initialization power supply Vint may be transmitted to the first node N1. Here, the voltage of the initialization power supply Vint may be a minimum voltage of a data signal or less.

The fifth transistor T5 may be coupled between the first power supply VDD and the first electrode of the first transistor T1. A gate electrode of the fifth transistor T5 may be coupled to a corresponding emission control line, e.g., an i-th emission control line Ei. The fifth transistor T5 may be turned off when an emission control signal having a gate-off voltage (e.g., a high voltage) is supplied to the emission control line Ei, and may be turned on when an emission control signal having a gate-on voltage (e.g., a low voltage) is supplied to the emission control line Ei.

The sixth transistor T6 may be coupled between the second electrode of the first transistor T1 and the first electrode of the light emitting unit LSU (for example, the second node N2). A gate electrode of the sixth transistor T6 may be coupled to a corresponding emission control line, e.g., an i-th emission control line Ei. The sixth transistor T6 may be turned off when an emission control signal of a gate-off voltage is supplied to the emission control line Ei, and may be turned on when an emission control signal having a gate-on voltage (e.g., a low voltage) is supplied to the emission control line Ei.

The seventh transistor T7 may be connected between the first electrode of the light emitting unit LSU and the initialization power supply Vint. A gate electrode of the seventh transistor T7 may be coupled to any one of scan lines of a subsequent stage, e.g., to the i+1-th scan line Si+1. When a scan signal having a gate-on voltage is supplied to the i+1-th scan line Si+1, the seventh transistor T7 may be turned on so that the voltage of the initialization power supply Vint may be supplied to the first electrode of the light emitting unit LSU.

The storage capacitor Cst may be coupled between the first power supply VDD and the first node N1. The storage capacitor Cst may store a voltage (or a charge) corresponding both to the data signal applied to the first node N1 during each frame period and to the threshold voltage of the first transistor T1.

Although FIG. 5C illustrates that the transistors included in the pixel circuit PXC, e.g., the first to seventh transistors T1 to T7, are P-type transistors, the present disclosure is not limited to this. For example, at least one of the first to seventh transistors T1 to T7 may be changed to an N-type transistor. In this case, the voltage level of a control signal (e.g., a scan signal and/or a data signal) for controlling at least one of the first to seventh transistors T1 to T7 may be changed.

Furthermore, the structure of the sub-pixel SPX that may be applied to the present disclosure is not limited to the embodiments shown in FIGS. 5A-5C, and the sub-pixel SPX may have various well-known structures. For example, the pixel circuit PXC included in the sub-pixel SPX may be formed of a well-known pixel circuit which may have various structures and/or be operated by various driving schemes. In an embodiment of the present disclosure, the sub-pixel SPX may be configured in a passive light emitting display device or the like. In this case, the pixel circuit PXC may be omitted, and each of the first and second pixel electrodes of the light emitting unit LSU may be directly coupled to the scan line Si, the data line Dj, a power line, and/or the control line.

Figure 6:
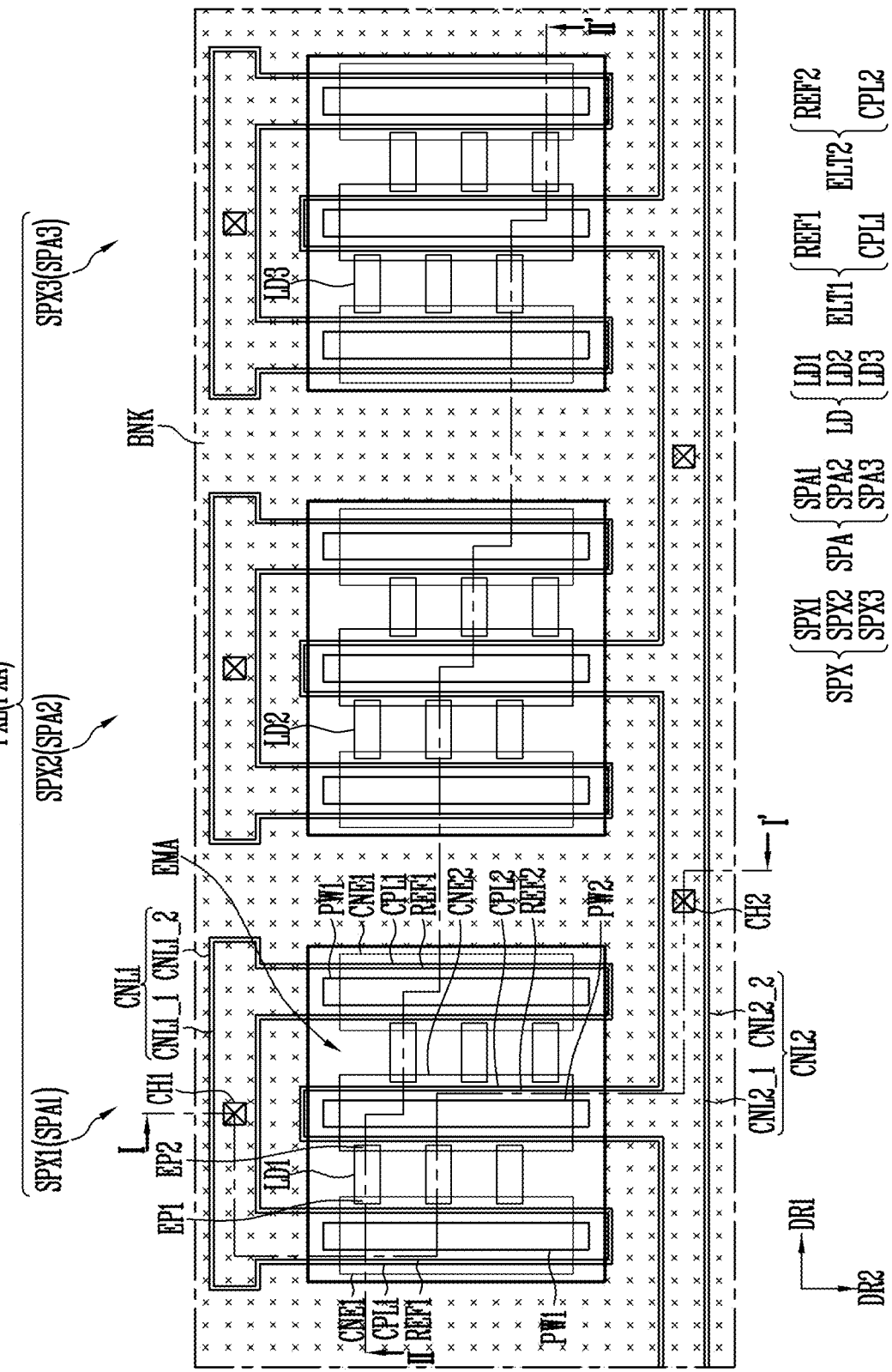
FIG. 6 is a plan view illustrating an example of a pixel included in the display device of FIG. 4.

FIG. 6 is a plan view illustrating an example of a pixel included in the display device of FIG. 4. FIG. 6 illustrates the structure of the pixel PXL, focused on a display element layer on which the light emitting elements LD of the pixel PXL are disposed.

Referring to FIGS. 4-6, the pixel PXL is formed in a pixel area PXA defined on the base layer SUB1. The pixel area PXA may include sub-pixel areas SPA corresponding to a plurality of sub-pixels SPX constituting the pixel PXL.

For example, the pixel area PXA may include a first sub-pixel area SPA1 in which a first sub-pixel SPX1 is formed, a second sub-pixel area SPA2 in which a second sub-pixel SPX2 is formed, and a third sub-pixel area SPA3 in which a third sub-pixel SPX3 is formed. Each of the first to third sub-pixel areas SPA1, SPA2, and SPA3 may include at least one pair of first electrode ELT1 and second electrode ELT2, and an emission area EMA in which at least one light emitting element LD coupled between the first and second electrodes ELT1 and ELT2 is disposed. In an embodiment, each emission area EMA may be defined by the bank BNK that encloses the emission area EMA.

In an embodiment, the first sub-pixel SPX1 may include a first electrode ELT1 and a second electrode ELT2 disposed at positions that are spaced from each other in the first sub-pixel area SPA1 corresponding to the first sub-pixel SPX1, and at least one first light emitting element LD1 coupled between the first and second electrodes ELT1 and ELT2. For example, the first sub-pixel SPX1 may include a plurality of first light emitting elements LD1 coupled in parallel to each other between the first and second electrodes ELT1 and ELT2.

In an embodiment, the second sub-pixel SPX2 may include a first electrode ELT1 and a second electrode ELT2 disposed at positions that are spaced from each other in the second sub-pixel area SPA2 corresponding to the second sub-pixel SPX2, and at least one second light emitting element LD2 coupled between the first and second electrodes ELT1 and ELT2. For example, the second sub-pixel SPX2 may include a plurality of second light emitting elements LD2 coupled in parallel to each other between the first and second electrodes ELT1 and ELT2.

In an embodiment, the third sub-pixel SPX3 may include a first electrode ELT1 and a second electrode ELT2 disposed at positions that are spaced from each other in the third sub-pixel area SPA3 corresponding to the third sub-pixel SPX3, and at least one third light emitting element LD3 coupled between the first and second electrodes ELT1 and ELT2. For example, the third sub-pixel SPX3 may include a plurality of third light emitting elements LD3 coupled in parallel to each other between the first and second electrodes ELT1 and ELT2.

In an embodiment, the structures of the first, second, and third sub-pixels SPX1, SPX2, and SPX3 may be substantially identical or similar to each other. For the sake of convenience, hereinafter, any one of the first, second, and third sub-pixels SPX1, SPX2, and SPX3 will be collectively designated as a sub-pixel SPX, an area in which the sub-pixel SPX is formed will be collectively designated as a sub-pixel area SPA, at least one first, second, or third light emitting element LD1, LD2, or LD3 disposed in the sub-pixel area SPA will be collectively designated as a light emitting element LD, and the structure of the sub-pixel SPX will be described in detail.

In an embodiment, the sub-pixel SPX may include at least one pair of first electrode ELT1 and second electrode ELT2 disposed at positions that are spaced from each other in the sub-pixel area SPA, a first bank pattern PW1 and a first contact electrode CNE1 that overlap one area of the first electrode ELT1, a second bank pattern PW2 and a second contact electrode CNE2 that overlap one area of the second electrode ELT2, and at least one light emitting element LD (e.g., a plurality of light emitting elements coupled in parallel to each other) coupled between the first and second electrodes ELT1 and ELT2.

In an embodiment, the first electrode ELT1 and the second electrode ELT2 may be disposed at positions that are spaced from each other in each sub-pixel area SPA such that at least portions thereof face each other. For example, the first and second electrodes ELT1 and ELT2 may be disposed in parallel to each other in the emission area EMA at positions that are spaced from each other by a suitable distance (e.g., a set or predetermined distance) along the first direction DR1, and each may extend in the second direction DR2 intersecting with the first direction DR1. However, the present disclosure is not limited thereto. For example, the shapes and/or mutual arrangement relationship of the first and second electrodes ELT1 and ELT2 may be changed in various ways.

In an embodiment, each of the first and second electrodes ELT1 and ELT2 may have a single-layer or multilayer structure. For example, the first electrode ELT1 may have a multilayer structure including a first reflective electrode REF1 and a first conductive capping layer CPL1. The second electrode ELT2 may have a multilayer structure including a second reflective electrode REF2 and a second conductive capping layer CPL2.

Furthermore, each of the first and second reflective electrodes REF1 and REF2 may have a single-layer or multilayer structure. For example, each first reflective electrode REF1 may include at least one reflective conductive layer, and may selectively further include at least one transparent conductive layer disposed over and/or under the reflective conductive layer. Likewise, each second reflective electrode REF2 may include at least one reflective conductive layer, and may selectively further include at least one transparent conductive layer disposed over and/or under the reflective conductive layer.

In an embodiment, the first electrode ELT1 may be coupled to a first connection electrode CNL1. For instance, the first electrode ELT1 may be integrally coupled to the first connection electrode CNL1. For example, the first electrode ELT1 may be formed of at least one branch diverging from the first connection electrode CNL1. In the case where the first electrode ELT1 and the first connection electrode CNL1 are formed integrally with each other, the first connection electrode CNL1 may be regarded as an area of the first electrode ELT1. However, the present disclosure is not limited thereto. For example, in an embodiment of the present disclosure, the first electrode ELT1 and the first connection electrode CNL1 may be individually formed and electrically coupled to each other through at least one contact hole, via hole, or the like.

In an embodiment, the first electrode ELT1 and the first connection electrode CNL1 may extend in different directions in the sub-pixel area SPA. For example, when the first connection electrode CNL1 extends in the first direction DR1, the first electrode ELT1 may extend in the second direction DR2 intersecting with the first direction DR1.

In an embodiment, the first connection electrode CNL1 may have a single-layer or multilayer structure. For example, the first connection electrode CNL1 may include a 1_1-th connection electrode CNL1_1 integrally coupled with the first reflective electrode REF1, and a 1_2-th connection electrode CNL1_2 integrally coupled with the first conductive capping layer CPL1. In an embodiment, the first connection electrode CNL1 may have the same cross-sectional structure (or stacked structure) as that of the first electrode ELT1, but the present disclosure is not limited thereto.

In an embodiment, the first electrode ELT1 and the first connection electrode CNL1 may be coupled, through a first contact hole CH1, to a pixel circuit PXC of each sub-pixel SPX, e.g., the pixel circuit PXC illustrated in any one of FIGS. 5A-5C. In an embodiment, the first contact hole CH1 may be disposed outside the emission area EMA of each sub-pixel SPX. For example, the first contact hole CH1 may be disposed around the corresponding emission area EMA such that the first contact hole CH1 overlaps the bank BNK. In this case, the first contact hole CH1 is covered with the bank BNK, so as to prevent the reflection of the pattern in the emission area EMA. However, the present disclosure is not limited thereto. For example, in an embodiment of the present disclosure, at least one first contact hole CH1 may be disposed in the emission area EMA.

In an embodiment, the pixel circuit PXC may be disposed under the light emitting elements LD disposed in the corresponding sub-pixel area SPA. For example, each pixel circuit PXC may be formed in a pixel circuit layer (or a pixel element layer including a circuit element such as a transistor) under the light emitting elements LD and coupled to the first electrode ELT1 through the first contact hole CH1.

In an embodiment, the second electrode ELT2 may be coupled to a second connection electrode CNL2. For instance, the second electrode ELT2 may be integrally coupled to the second connection electrode CNL2. For example, the second electrode ELT2 may be formed of at least one branch diverging from the second connection electrode CNL2. In the case where the second electrode ELT2 and the second connection electrode CNL2 are formed integrally with each other, the second connection electrode CNL2 may be regarded as an area of the second electrode ELT2. However, the present disclosure is not limited thereto. For example, in an embodiment of the present disclosure, the second electrode ELT2 and the second connection electrode CNL2 may be individually formed and electrically coupled to each other through at least one contact hole, via hole, or the like.

In an embodiment, the second electrode ELT2 and the second connection electrode CNL2 may extend in different directions in the sub-pixel area SPA. For example, when the second connection electrode CNL2 extends in the first direction DR1, the second electrode ELT2 may extend in the second direction DR2 intersecting with the first direction DR1.

In an embodiment, the second connection electrode CNL2 may have a single-layer or multilayer structure. For example, the second connection electrode CNL2 may include a 2_1-th connection electrode CNL2_1 integrally coupled with the second reflective electrode REF2, and a 2_2-th connection electrode CNL2_2 integrally coupled with the second conductive capping layer CPL2. In an embodiment, the second connection electrode CNL2 may have the same cross-sectional structure (stacked structure) as that of the second electrode ELT2, but the present disclosure is not limited thereto.

In an embodiment, the second electrode ELT2 and the second connection electrode CNL2 may be coupled to the second power supply VSS. For example, the second electrode ELT2 and the second connection electrode CNL2 may be coupled to the second power supply VSS through a second contact hole CH2, and a power line coupled thereto. In an embodiment, the second contact hole CH2 may be disposed outside the emission area EMA of each sub-pixel SPX. For example, the second contact hole CH2 may be disposed around the corresponding emission area EMA such that the second contact hole CH2 overlaps the bank BNK. In this case, the second contact hole CH2 may be covered with the bank BNK, so as to prevent the reflection of the pattern in the emission area EMA. However, the present disclosure is not limited thereto. For example, in an embodiment of the present disclosure, at least one second contact hole CH2 may be disposed in the emission area EMA.

In an embodiment, an area of the power line for supplying the second power supply VSS may be disposed in the pixel circuit layer under the light emitting elements LD. For example, the power line is disposed on the pixel circuit layer under the light emitting elements LD and coupled to the second electrode ELT2 through the second contact hole CH2. However, the present disclosure is not limited to the foregoing structure, and the position of the power line may be changed in various ways.

In an embodiment, the first bank pattern PW1 may be disposed under the first electrode ELT1 and overlap one area of the first electrode ELT1. The second bank pattern PW2 may be disposed under the second electrode ELT2 and overlap one area of the second electrode ELT2. The first and second bank patterns PW1 and PW2 may be disposed in the emission area EMA at positions that are spaced from each other along the first direction DR1, and make areas of the first and second electrode ELT1 and ELT2 protrude upward. For example, the first electrode ELT1 may be disposed on the first bank pattern PW1 and protrude in a height direction (or a thickness direction) of the base layer SUB1 by the first bank pattern PW1. The second electrode ELT2 may be disposed on the second bank pattern PW2 and protrude in the height direction (or the thickness direction) of the base layer SUB1 by the second bank pattern PW2.

In an embodiment, at least one light emitting element LD, e.g., a plurality of light emitting elements LD, may be arranged between the first and second electrodes ELT1 and ELT2 of the sub-pixel SPX. For example, at least one first light emitting element LD1 may be disposed between the first and second electrodes ELT1 and ELT2 of the first sub-pixel SPX1. At least one second light emitting element LD2 may be disposed between the first and second electrodes ELT1 and ELT2 of the second sub-pixel SPX2. At least one third light emitting element LD3 may be disposed between the first and second electrodes ELT1 and ELT2 of the third sub-pixel SPX3. For example, in each sub-pixel area SPA, a plurality of light emitting elements LD may be coupled in parallel to each other in an area in which the first electrode ELT1 and the second electrode ELT2 are disposed to face (or be opposite) each other.

Although FIG. 6 illustrates that the light emitting elements LD have been illustrated as being arranged between the first and second electrodes ELT1 and ELT2 in the first direction DR1, e.g., in a horizontal direction, the arrangement direction of the light emitting elements LD is not limited thereto. For example, at least one of the light emitting elements LD may be oriented in a diagonal direction.

In an embodiment, the first, second, and third light emitting elements LD1, LD2, and LD3 may emit light having the same color or different colors. For example, each first light emitting element LD1 may be a red light emitting diode configured to emit red light. Each second light emitting element LD2 may be a green light emitting diode configured to emit green light. Each third light emitting element LD3 may be a blue light emitting diode configured to emit blue light.

For example, all of the first, second, and third light emitting elements LD1, LD2, and LD3 may be formed of blue light emitting diodes configured to emit blue light. In this case, in order to form a full-color pixel PXL, a light conversion layer and/or a color filter for converting the color of light emitted from the corresponding sub-pixel SPX may be disposed on at least some of the first to third sub-pixels SPX1, SPX2, and SPX3.

Each of the light emitting elements LD are electrically coupled between the first and second electrodes ELT1 and ELT2 of the sub-pixel SPX. For example, the first end EP1 of each of the light emitting elements LD may be electrically coupled to the first electrode ELT1 of the sub-pixel SPX, and the second end EP2 of each of the light emitting elements LD may be electrically coupled to the second electrode ELT2 of the corresponding sub-pixel SPX.

In an embodiment, the first end of each of the light emitting elements LD may be electrically coupled to the corresponding first electrode ELT1 through at least one contact electrode, e.g., the first contact electrode CNE1, rather than being directly disposed on the first electrode ELT1. However, the present disclosure is not limited thereto. For example, in an embodiment of the present disclosure, the first ends EP1 of the light emitting elements LD may come into direct contact with the corresponding first electrode ELT1 and may be electrically coupled to the first electrode ELT1.

Likewise, the second end EP2 of each of the light emitting elements LD may be electrically coupled to the corresponding second electrode ELT2 through at least one contact electrode, e.g., the second contact electrode CNE2, rather than being directly disposed on the second electrode ELT2. However, the present disclosure is not limited thereto. For example, in an embodiment of the present disclosure, the second end EP2 of each of the light emitting elements LD may come into direct contact with the second electrode ELT2 and may be electrically coupled to the second electrode ELT2.

In an embodiment, each of the light emitting elements LD may be formed of a light emitting diode which is made of material having an inorganic crystal structure and has a subminiature size, e.g., corresponding to the nanometer or micrometer scale. For example, each of the first, second, and third light emitting elements LD1, LD2, and LD3 may be formed of a subminiature rod-type light emitting diode having a size corresponding to the nanometer or micrometer scale, as shown in any one of FIGS. 1A-3B. However, the type of light emitting elements LD which may be applied to the present disclosure is not limited thereto. For example, the light emitting element LD may be formed by a growth scheme and be a light emitting diode having a core-shell structure having a size corresponding to, e.g., the nanometer scale to the micrometer scale.

In an embodiment, the light emitting elements LD may be prepared in a diffused form in a suitable solution (e.g., a set or predetermined solution), and then supplied to the emission area EMA of each sub-pixel SPX by an inkjet printing scheme or a slit coating scheme. For example, the light emitting elements LD may be mixed with a volatile solvent and supplied to the emission area EMA. Here, if suitable voltages (e.g., set or predetermined voltages) are supplied to the first and second electrodes ELT1 and ELT2 of the sub-pixel SPX, an electric field is formed between the first and second electrodes ELT1 and ELT2, whereby the light emitting elements LD are self-aligned between the first and second electrodes ELT1 and ELT2. After the light emitting elements LD have been aligned, the solvent may be removed by a volatilization scheme or other schemes. In this way, the light emitting elements LD may be reliably arranged between the first and second electrodes ELT1 and ELT2. Furthermore, because the first contact electrode CNE1 and the second contact electrode CNE2 are formed on the first ends EP1 and the second ends EP2 of the light emitting elements LD, the light emitting elements LD may be reliably coupled between the first and second electrodes ELT1 and ELT2.

In an embodiment, the first contact electrode CNE1 may be formed on the first ends EP1 of the light emitting elements LD and at least one area of the first electrode ELT1 corresponding to the first end EP1, whereby the first ends EP1 of the light emitting elements LD may be physically and/or electrically coupled to the first electrode ELT1. Likewise, the second contact electrode CNE2 may be formed on the second ends EP2 of the light emitting elements LD and at least one area of the second electrode ELT2 corresponding to the second end EP2, whereby the second ends EP2 of the light emitting elements LD may be physically and/or electrically coupled to the second electrode ELT2.

The light emitting elements LD disposed in the sub-pixel area SPA may gather, thus forming a light source of the corresponding sub-pixel SPX. For example, if driving current flows through at least one sub-pixel SPX during each frame period, the light emitting elements LD that are coupled in the forward direction between the first and second electrodes ELT1 and ELT2 of the sub-pixel SPX may emit light having a luminance corresponding to the driving current.

In an embodiment, the emission area EMA may be enclosed by the bank BNK. For example, the display device may include the bank BNK disposed between the first, second, and third sub-pixels SPX1, SPX2, SPX3 to enclose the emission area EMA of each of the first, second, and third sub-pixels SPX1, SPX2, and SPX3.

In an embodiment, the bank BNK may be disposed or formed on a conductive layer or a conductive pattern. The conductive pattern may prevent residues of the bank BNK from remaining in the emission area EMA, etc.

Figure 7:
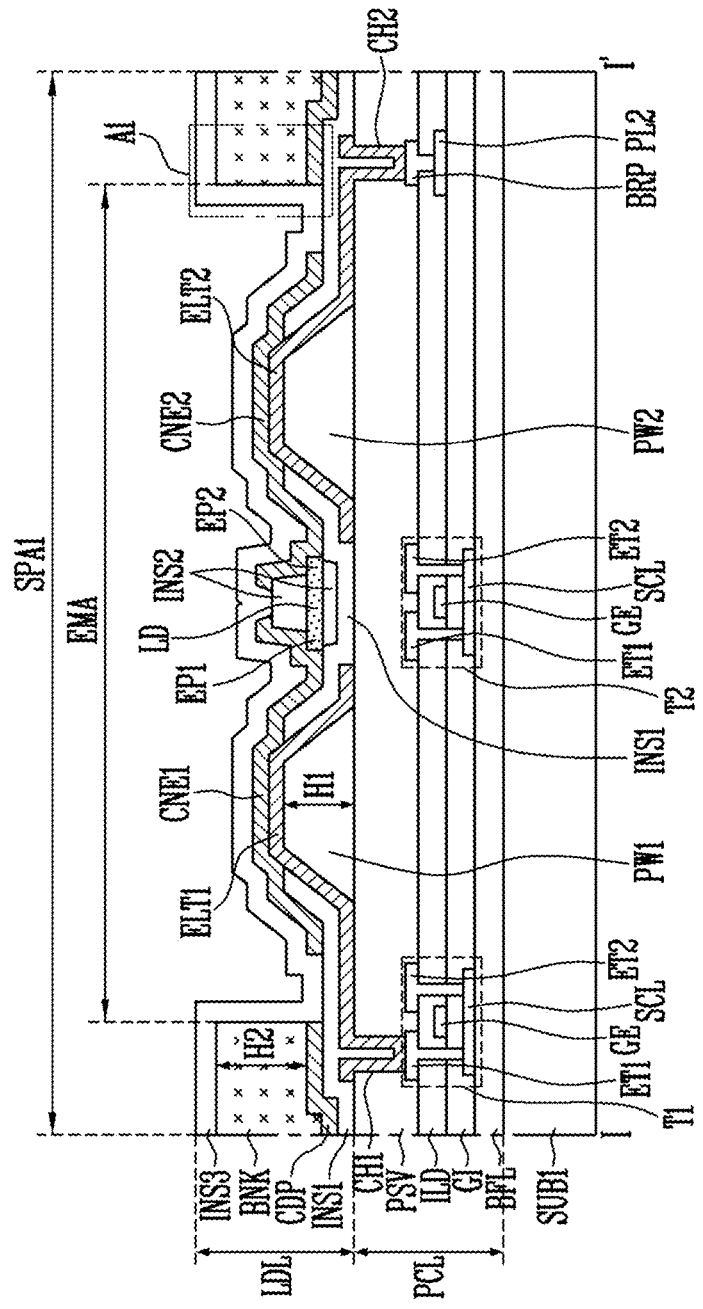
FIG. 7 is a sectional view illustrating an example of the sub-pixel, taken along the line I-I' of FIG. 6.
Figure 8A:
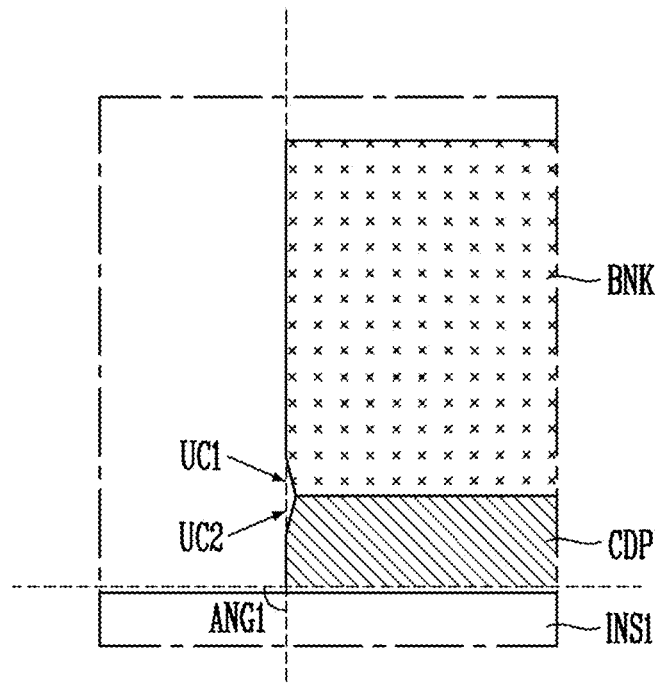
FIGS. 8A and 8B are enlarged sectional views illustrating examples of a first area of FIG. 7.
Figure 8B:
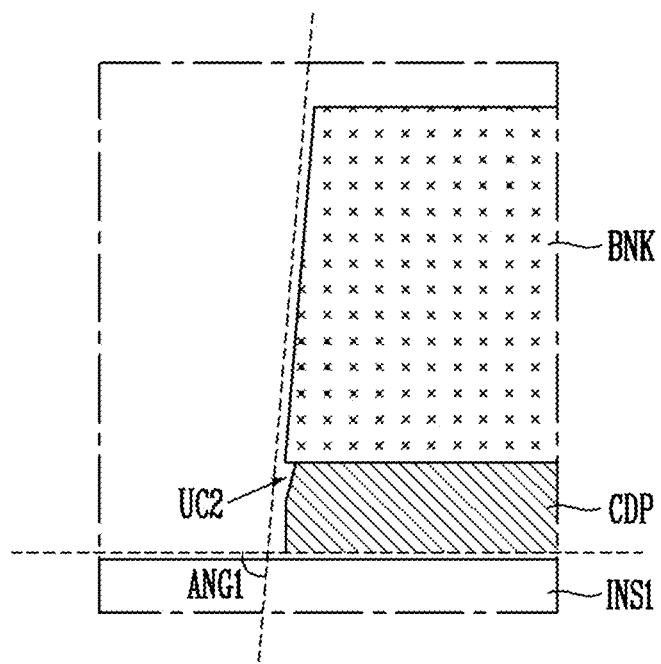

FIG. 7 is a sectional view illustrating an example of the sub-pixel, taken along the line I-I' of FIG. 6. FIGS. 8A and 8B are enlarged sectional views illustrating examples of a first area of FIG. 7.

In an embodiment, FIG. 7 illustrates any one sub-pixel area SPA formed in the display panel PNL. In an embodiment, the cross-sectional structures of the first, second, and third sub-pixels SPX1, SPX2, and SPX3 described above may be substantially identical or similar to each other. Therefore, for the sake of convenience, with reference to FIG. 7, by illustrating the cross-section of the first sub-pixel area SPA1 corresponding to the line I-I' of FIG. 6, the structure of each sub-pixel SPX will be comprehensively described.

Referring to FIGS. 1A, 1B, 6, and 7, the pixel circuit layer PCL and the display element layer LDL may be successively disposed in each sub-pixel area SPA on the base layer SUB1. In an embodiment, the pixel circuit layer PCL and the display element layer LDL may be formed on the entirety of the display area DA of the display panel PNL.

In an embodiment, the pixel circuit layer PCL may include circuit elements which constitute the pixel circuits PXC of the sub-pixels SPX. The display element layer LDL may include light emitting elements LD of the sub-pixels SPX.

For example, in the first sub-pixel area SPA1 on the base layer SUB1, the pixel circuit layer PCL including circuit elements constituting the pixel circuit PXC of the corresponding first sub-pixel SPX1, and the display element layer LDL including at least one light emitting element LD, e.g., a plurality of first light emitting elements LD1, provided in the first sub-pixel SPX1 may be successively disposed on one surface of the base layer SUB1. Likewise, in the second sub-pixel area SPA2 on the base layer SUB1, the pixel circuit layer PCL including circuit elements constituting the pixel circuit PXC of the corresponding second sub-pixel SPX2, and the display element layer LDL including a plurality of second light emitting elements LD2 provided in the second sub-pixel SPX2 may be successively disposed on the one surface of the base layer SUB1. Likewise, in the third sub-pixel area SPA3 on the base layer SUB1, the pixel circuit layer PCL including circuit elements constituting the pixel circuit PXC of the corresponding third sub-pixel SPX3, and the display element layer LDL including a plurality of third light emitting elements LD3 provided in the third sub-pixel SPX3 may be successively disposed on the one surface of the base layer SUB1.

In this way, the pixel circuit layer PCL and the display element layer LDL may be successively disposed in the display area DA on the base layer SUB1. For example, the pixel circuit layer PCL may be formed on a surface of the base layer SUB1, and the display element layer LDL may be formed over the surface of the base layer SUB1 on which the pixel circuit layer PCL is formed. For example, the pixel circuit layer PCL may be on a surface of the base layer SUB1, and the display element layer LDL may be disposed over the pixel circuit layer PCL.

In an embodiment, the pixel circuit layer PCL may include a plurality of circuit elements disposed in the display area DA. For example, the pixel circuit layer PCL may include a plurality of circuit elements which are formed in the sub-pixel area SPA to form the pixel circuit PXC of the corresponding sub-pixel SPX. For example, the pixel circuit layer PCL may include a plurality of transistors disposed in the sub-pixel area SPA, e.g., the first and second transistors T1 and T2 of FIGS. 5A and 5B. In some embodiments, the pixel circuit layer PCL of FIG. 7 may include a storage capacitor Cst disposed in the sub-pixel area SPA, various signal lines (e.g., the scan line Si and the data line Dj illustrated in FIGS. 5A and 5B) coupled to the pixel circuit PXC, and various power lines (e.g., a first power line and a second power line PL2 configured to respectively transmit the voltage of the first power supply VDD and the voltage of the second power supply VSS) coupled to the pixel circuit PXC and/or the light emitting elements LD.

In an embodiment, a plurality of transistors, e.g., first and second transistors T1 and T2, provided in the pixel circuit PXC may have substantially an identical or similar cross-sectional structure. However, the present disclosure is not limited thereto. In an embodiment, at least some of the plurality of transistors may have different types and/or structures.

In addition, the pixel circuit layer PCL may include a plurality of insulating layers. For example, the pixel circuit layer PCL may include a buffer layer BFL, a gate insulating layer GI, an interlayer insulating layer ILD, and a passivation layer PSV which are successively stacked on one surface of the base layer SUB1.

In an embodiment, the buffer layer BFL may prevent impurities from diffusing into the circuit elements. The buffer layer BFL may be formed of a single layer, or may be formed of multiple layers having at least double or more layers. In the case where the buffer layer BFL has a multilayer structure, the respective layers may be formed of the same material or different materials. In an embodiment, the buffer layer BFL may be omitted.

In an embodiment, each of the first and second transistors T1 and T2 may include a semiconductor layer SCL, a gate electrode GE, a first transistor electrode ET1, and a second transistor electrode ET2. Although FIG. 7 illustrates that each of the first and second transistors T1 and T2 includes the first transistor electrode ET1 and the second transistor electrode ET2 that are formed separately from the semiconductor layer SCL, the present disclosure is not limited thereto. For example, in an embodiment of the present disclosure, the first and/or second transistor electrode ET1 and/or ET2 provided in at least one transistor disposed in each sub-pixel area SPA may be integrally formed with the corresponding semiconductor layer SCL.

The semiconductor layer SCL may be disposed on the buffer layer BFL. For example, the semiconductor layer SCL may be disposed between the gate insulating layer GI and the base layer SUB1 on which the buffer layer BFL is formed. The semiconductor layer SCL may include a first area which comes into contact with a first transistor electrode ET1, a second area which comes into contact with a second transistor electrode ET2, and a channel area disposed between the first and second areas. In an embodiment, one of the first and second areas may be a source area, and the other one may be a drain area.

In an embodiment, the semiconductor layer SCL may be a semiconductor pattern formed of polysilicon, amorphous silicon, an oxide semiconductor, etc. The channel area of the semiconductor layer SCL may be an intrinsic semiconductor, which is an undoped semiconductor pattern. Each of the first and second areas of the semiconductor layer SCL may be a semiconductor pattern doped with a suitable impurity (e.g., a set or predetermined impurity).

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least one area of the semiconductor layer SCL.

The first and second transistor electrodes ET1 and ET2 may be disposed over the semiconductor layer SCL and the gate electrode GE with at least one interlayer insulating layer ILD (and the gate insulating layer GI) interposed therebetween. For example, the first and second transistor electrodes ET1 and ET2 may be disposed between the interlayer insulating layer ILD and the passivation layer PSV. The first and second transistor electrodes ET1 and ET2 may be electrically coupled to the semiconductor layer SCL. For example, the first and second transistor electrodes ET1 and ET2 may be respectively coupled to the first area and the second area of the semiconductor layer SCL through respective contact holes that pass through the gate insulating layer GI and the interlayer insulating layer ILD.

In an embodiment, any one of the first and second transistor electrodes ET1 and ET2 of at least one transistor (e.g., the first transistor T1 shown in FIGS. 5A and 5B) provided on the pixel circuit PXC may be electrically coupled, through the first contact hole CH1 passing through the passivation layer PSV, to the first electrode ELT1 of the light emitting unit LSU disposed over the passivation layer PSV.

In an embodiment, at least one signal line and/or power line that is coupled to the sub-pixel SPX may be disposed on a layer identical with that of one electrode of each of the circuit elements that form the pixel circuit PXC. For example, the second power line PL2 for supplying the voltage of the second power supply VSS may be disposed on a layer identical with that of the gate electrode GE of each of the first and second transistors T1 and T2, and electrically coupled to the second electrode ELT2 of the light emitting unit LSU that is disposed over the passivation layer PSV, both through a bridge pattern BRP disposed on the same layer as that of the first and second transistor electrodes ET1 and ET2 and through at least one second contact hole CH2 passing through the passivation layer PSV. However, the structures and/or positions of the second power line PL2, etc. may be changed in various ways.

In an embodiment, the display element layer LDL may include first and second bank patterns PW1 and PW2, first and second electrodes ELT1 and ELT2, a first insulating layer INS1, light emitting elements LD, a second insulating layer INS2, first and second contact electrodes CNE1 and CNE2, and a third insulating layer INS3, which are successively disposed and/or formed on the pixel circuit layer PCL.

The first and second bank patterns PW1 and PW2 may be disposed on the pixel circuit layer PCL. The first and second bank patterns PW1 and PW2 may be disposed at positions that are spaced from each other in the emission area EMA. The first and second bank patterns PW1 and PW2 may protrude in a height direction (e.g., the thickness direction of the base layer SUB1) on the pixel circuit layer PCL. In an embodiment, the first and second bank patterns PW1 and PW2 may have substantially the same height, but the present disclosure is not limited thereto.

In an embodiment, the first bank pattern PW1 may be disposed between the pixel circuit layer PCL and the first electrode ELT1. The first bank pattern PW1 may be disposed adjacent to the first ends EP1 of the light emitting elements LD. For example, one sidewall of the first bank pattern PW1 may be positioned adjacent to the first ends EP1 of the light emitting elements LD and disposed to face (or be oppose) the first ends EP1.

In an embodiment, the second bank pattern PW2 may be disposed between the pixel circuit layer PCL and the second electrode ELT2. The second bank pattern PW2 may be disposed adjacent to the second ends EP2 of the light emitting elements LD. For example, one sidewall of the second bank pattern PW2 may be positioned adjacent to the second ends EP2 of the light emitting elements LD and disposed to face (or be opposite) the second ends EP2.

In an embodiment, each of the first and second bank patterns PW1 and PW2 may have various shapes. For example, as illustrated in FIG. 7, each of the first and second bank patterns PW1 and PW2 may have a cross-sectional shape of a trapezoid that is reduced in width from a bottom to a top thereof. In this case, each of the first and second bank patterns PW1 and PW2 may have an inclined surface on at least one side. However, the shape of each of the first and second bank patterns PW1 and PW2 is not limited thereto.

Each of the first and second bank patterns PW1 and PW2 may include insulating material having inorganic material and/or organic material. For example, the first and second bank patterns PW1 and PW2 may include at least one inorganic layer including various inorganic insulating materials that are known to those skilled in the art, such as SiNx or SiOx. Alternatively, the first and second bank patterns PW1 and PW2 may include at least one organic layer and/or photoresist layer containing various known organic insulating materials, or may form a single- or multi-layer insulator containing organic/inorganic materials in combination. In other words, the materials of the first and second bank patterns PW1 and PW2 may be variously changed.

In an embodiment, each of the first and second bank patterns PW1 and PW2 may function as a reflective member. For example, the first and second bank patterns PW1 and PW2, along with the first and second electrodes ELT1 and ELT2 provided on the first and second bank patterns PW1 and PW2, may function as reflectors that guide light emitted from each light emitting element LD in a desired direction, thus enhancing the light efficiency of the pixel PXL.

The first and second electrodes ELT1 and ELT2 may be respectively disposed over the first and second bank patterns PW1 and PW2. The first and second electrodes ELT1 and ELT2 may be disposed at positions that are spaced from each other in the emission area EMA.

In an embodiment, the first and second electrodes ELT1 and ELT2 that are respectively disposed over the first and second bank patterns PW1 and PW2 may have shapes corresponding to the respective shapes of the first and second bank patterns PW1 and PW2. For example, the first and second electrodes ELT1 and ELT2 may have inclined surfaces or curved surfaces corresponding to the first and second bank patterns PW1 and PW2, respectively, and protrude in a height direction (or a thickness direction) of the display element layer LDL.

Each of the first and second electrodes ELT1 and ELT2 may include at least one conductive material. For example, each of the first and second electrodes ELT1 and ELT2 may include at least one of metal such as Ag, Mg, Al, Pt, Pd, Au, Ni, Nd, Ir, Cr, Ti or an alloy thereof, conductive oxide such as ITO, IZO, ZnO, or ITZO, and a conductive polymer such as PEDOT; however, the present disclosure is not limited thereto.

Each of the first and second electrodes ELT1 and ELT2 may have a single-layer or multilayer structure. For example, each of the first and second electrodes ELT1 and ELT2 may include at least one reflective electrode layer. Each of the first and second electrodes ELT1 and ELT2 may selectively further include at least one of at least one transparent electrode layer disposed on an upper portion and/or a lower portion of the reflective electrode layer, and at least one conductive capping layer covering an upper portion of the reflective electrode layer and/or the transparent electrode layer.

In an embodiment, the reflective electrode layer of each of the first and second electrodes ELT1 and ELT2 may be formed of conductive material having a uniform reflectivity. For example, the reflective electrode layer may include at least one of metals such as Ag, Mg, Al, Pt, Pd, Au, Ni, Nd, Ir, Cr, and an alloy thereof; however, the present disclosure is not limited thereto. In other words, reflective electrode layer may be formed of various reflective conductive materials. Each of the first and second electrodes ELT1 and ELT2 that includes the reflective electrode layer may enable light emitted from the opposite ends of each of the light emitting elements LD, i.e., the first and second ends EP1 and EP2, to travel in a direction (e.g., in a frontal direction) in which an image is displayed. For example, if the first and second electrodes ELT1 and ELT2 respectively have inclined or curved surfaces corresponding to the shapes of the first and second bank patterns PW1 and PW2 and are respectively disposed to face (or be opposite) the first and second ends EP1 and EP2 of the light emitting elements LD, light emitted from the first and second ends EP1 and EP2 of each light emitting elements LD may be reflected by the first and second electrodes ELT1 and ELT2 and thus more reliably travel in the frontal direction of the display panel PNL (e.g., in an upward direction of the base layer SUB1). Consequently, the efficiency of light emitted from the light emitting elements LD may be enhanced.

Furthermore, the transparent electrode layer of each of the first and second electrodes ELT1 and ELT2 may be formed of various transparent electrode materials. For example, the transparent electrode layer may include ITO, IZO or ITZO, but the present disclosure is not limited thereto. In an embodiment, each of the first and second electrodes ELT1 and ELT2 may have a triple-layer structure having a stacked structure of ITO/Ag/ITO. As such, if the first and second electrodes ELT1 and ELT2 each are formed of a multilayer structure of at least double or more layers, voltage drop due to signal delay (e.g., RC delay) may be reduced or minimized. Thus, a desired voltage can be effectively transmitted to the light emitting elements LD.

In addition, if each of the first and second electrodes ELT1 and ELT2 includes the conductive capping layer covering the reflective electrode layer and/or the transparent electrode layer, it is possible to prevent the reflective electrode layer of the first and second electrodes ELT1 and ELT2 from being damaged due to defects caused during the manufacturing process of the pixel PXL. However, the conductive capping layer may be selectively included in the first and second electrodes ELT1 and ELT2, and may be omitted according to an embodiment. Furthermore, the conductive capping layer may be considered as a component of each of the first and second electrodes ELT1 and ELT2, or considered as a separate component disposed on the first and second electrodes ELT1 and ELT2.

The first insulating layer INS1 may be disposed on one area of each of the first and second electrode ELT1 and ELT2. For example, the first insulating layer INS1 may be formed to cover some areas (e.g., set or predetermined areas) of the first and second electrodes ELT1 and ELT2, and may include an opening to expose other areas (e.g., set or predetermined areas) of the first and second electrodes ELT1 and ELT2.

In an embodiment, the first insulating layer INS1 may be primarily formed to cover the overall surfaces of the first and second electrodes ELT1 and ELT2. After the light emitting elements LD are supplied and aligned on the first insulating layer INS1, the first insulating layer INS1 may be partially open to expose the first and second electrodes ELT1 and ELT2 in the first and second contactors. Alternatively, the first insulating layer INS1 may be patterned in the form of an individual pattern which is sectionally disposed under the light emitting elements LD after the supply and alignment of the light emitting elements LD have been completed.

In other words, the first insulating layer INS1 may be interposed between the first and second electrodes ELT1 and ELT2 and the light emitting elements LD, and may expose at least one area of each of the first and second electrodes ELT1 and ELT2. After the first and second electrodes ELT1 and ELT2 are formed, the first insulating layer INS1 may be formed to cover the first and second electrodes ELT1 and ELT2, so that it is possible to prevent the first and second electrodes ELT1 and ELT2 from being damaged or to prevent metal from being precipitated in a subsequent process. Furthermore, the first insulating layer INS1 may stably support each light emitting element LD.

The light emitting elements LD may be supplied onto and aligned in the emission area EMA on which the first insulating layer INS1 is formed. For example, a plurality of light emitting elements LD may be supplied to the emission area EMA through an inkjet method or the like, and the light emitting elements LD may be aligned between the first and second electrodes ELT1 and ELT2 by suitable alignment voltages (e.g., set or predetermined alignment voltages) (or alignment signals) applied to the first and second electrodes ELT1 and ELT2.

The conductive pattern CDP may be disposed on the first insulating layer INS1. For example, the conductive pattern CDP may be formed between the sub-pixels SPX to enclose the emission area EMA of each of the sub-pixels SPX. Hence, the conductive pattern CDP may not overlap the first and second bank patterns PW1 and PW2 disposed in the emission area EMA. However, the present disclosure is not limited to this.

The conductive pattern CDP may prevent a lower structure (e.g., the first insulating layer INS1, the first and second electrodes ELT1 and ELT2, etc.) from being damaged when the bank BNK is formed, and may be used to remove residues which may remain in the emission area EMA when the bank BNK is formed. The conductive pattern CDP may allow the light emitting elements LD to be appropriately aligned in the emission area EMA. For example, the conductive pattern CDP may offset an electric field formed between the adjacent sub-pixels SPX, and thus prevent the light emitting elements LD from being aligned in outer vicinities of the sub-pixels SPX. Consequently, the light emitting elements LD may be appropriately aligned in the emission area EMA of the sub-pixel SPX. The function of the conductive pattern CDP will be described below with reference to FIGS. 11A-11E.

The conductive pattern CDP may be electrically insulated from the first and second electrodes ELT1 and ELT2 by the first insulating layer INS1. The conductive pattern CDP may be disposed on the same layer as that of the first and second contact electrodes CNE1 and CNE2, and may be spaced from the first and second contact electrodes CNE1 and CNE2 and electrically insulated from the first and second contact electrodes CNE1 and CNE2 by the third insulating layer INS3. The conductive pattern CDP may be in an electrically-insulated floating state. However, the present disclosure is not limited thereto. For example, the conductive pattern CDP may be coupled to a reference voltage source (e.g., a set or predetermined reference voltage source).

Although will be described with reference to FIGS. 11A-11E, the conductive pattern CDP may be formed through a process different from that of the first and second contact electrodes CNE1 and CNE2. The conductive pattern CDP may have material different from that of the first and second contact electrodes CNE1 and CNE2 and/or a cross-sectional structure (e.g., a stacked structure) different therefrom. For example, the conductive pattern CDP may have a thickness different from (e.g., less than) that of the first and second contact electrodes CNE1 and CNE2. The thickness of the conductive pattern CDP may be 2000 Å or less, or 1000 Å or less. However, the present disclosure is not limited thereto.

In some embodiments, the conductive pattern CDP may include at least one conductive material. In some embodiments, the conductive pattern CDP may include transparent conductive material. For example, the conductive pattern CDP may include indium tin oxide (ITO), indium zinc oxide (IZO), aluminum-doped zinc oxide (AZO), gallium indium zinc oxide (GIZO), zinc oxide (ZnO), or a compound thereof. However, the material constituting the conductive pattern CDP is not limited thereto. The conductive pattern CDP may be formed various conductive materials capable of being removed by wet-etching, and the constituent material thereof is not particularly limited.

A bank BNK may be disposed on the conductive pattern CDP. For example, the bank BNK may be formed between the sub-pixels SPX to enclose the respective emission areas EMA of the sub-pixels SPX, so that a pixel defining layer for defining the emission area EMA of the sub-pixel SPX may be formed. The bank BNK may overlap the conductive pattern CDP. For example, the bank BNK may substantially completely overlap the conductive pattern CDP in a plan view.

In an embodiment, the bank BNK may be formed to have a second height H2 greater than a first height H1 of the first and second bank patterns PW1 and PW2. For example, the first height H1 of the first and second bank patterns PW1 and PW2 may be approximately 2 μm, and the second height H2 of the bank BNK may be approximately 2.5 μm or more, or 2.7 μm or more. In other words, the second height H2 of the bank BNK may be equal to or greater than 1.2 times the first height H1 of the first and second bank patterns PW1 and PW2, or may be greater than the first height H1 by 0.5 μm or more. However, the second height H2 of the bank BNK is not limited thereto.

At the step of supplying the light emitting elements LD to each emission area EMA, the bank BNK may function as a dam structure configured to prevent a solution mixed with the light emitting elements LD from being drawn into the emission area EMA of an adjacent sub-pixel SPX or control the amount of solution such that a constant amount of solution is supplied to each emission area EMA.

The bank BNK may be formed to prevent light emitted from each emission area EMA from entering an adjacent emission area EMA and causing optical interference. To this end, the bank BNK may be formed to prevent light emitted from the light emitting elements LD of each sub-pixel SPX from passing through the bank BNK.

For example, the bank BNK may block or absorb light having suitable colors (e.g., set or predetermined colors) and/or wavelengths emitted from the first, second, and third light emitting elements LD1, LD2, and LD3. In an embodiment, the bank BNK may include color pigment (or color dye) having a color different from the color of light emitted from the first, second, and third light emitting elements LD1, LD2, and LD3. In some embodiments, the bank BNK may include black dye.

For example, the bank BNK may be formed of at least one color block layer including light shielding material or color filter material for blocking transmission of light having suitable colors (e.g., set or predetermined colors) and/or wavelengths emitted from the first, second, and third light emitting elements LD1, LD2, and LD3. Therefore, the bank BNK may function as a light shielding layer configured to prevent light emitted from the first, second, and third light emitting elements LD1, LD2, and LD3 from leaking into an adjacent emission area EMA.

In an embodiment of the present disclosure, the first, second, and third light emitting elements LD1, LD2, and LD3 may emit different colors of light. For example, the first, second, and third light emitting elements LD1, LD2, and LD3 may respectively emit red light, green light, and blue light. In this case, the bank BNK may include filter material for blocking light having red, green, and blue wavelength bands.

However, the bank BNK is not limited thereto. For example, in the case where all of the first, second, and third light emitting elements LD1, LD2, and LD3 emit blue light, the bank BNK may include color filter material which blocks light having a blue wavelength band and allows light having other wavelength bands, e.g., light having a desired color (e.g., a set or predetermined color) different from blue and wavelength bands other than the blue wavelength band, to pass therethrough.

For example, the bank BNK may include red-based color filter material for allowing light having a wavelength band relatively far from the blue wavelength band in a visible ray area, e.g., red light, to selectively pass therethrough. However, the material of the bank BNK is not limited to the foregoing material. For example, the bank BNK may include yellow-based color filter material. Alternatively, the bank BNK may include at least two colors of color filter materials. For example, the bank BNK may be formed of an orange color bank including a combination of red color pigment and yellow color pigment.

In this way, if the bank BNK is formed to include the color filter material for blocking light having a desired color (e.g., a set or predetermined color) emitted from the light emitting elements LD of each sub-pixel SPX, the bank BNK may effectively prevent light from leaking between adjacent sub-pixels SPX. Furthermore, in the case where the bank BNK include color filter material, residues of the bank BNK may be prevented from occurring compared to the case where black matrix material such as carbon black is used.

In some embodiments, the bank BNK may have various cross-sectional shapes. Description of the cross-sectional shape of the bank BNK will be made with reference to FIGS. 8A and 8B.

Referring to FIG. 8A, the bank BNK may have a rectangular cross-sectional shape. In other words, a sidewall of the bank BNK may be substantially perpendicular to an upper surface of the first insulating layer INS1 (or the base layer SUB1). An angle ANG1 between the sidewall of the bank BNK and the upper surface of the first insulating layer INS1 may be substantially a right angle. Here, the substantially right angle may be an angle ranging from 80° to 90°. Although will be described with reference to FIGS. 11A-11E, the bank BNK may be formed through a dry etching operation rather than using a photo process (or a photolithography process). Hence, the sidewall of the bank BNK may be substantially perpendicular to the upper surface of the first insulating layer INS1. Furthermore, through the dry etching operation, the bank BNK may be easily formed with a desired thickness without limitation of the photo process (the limitation that the thicker the bank BNK the more difficult it is to perform an exposure process and a development process).

However, the shape of the bank BNK is not limited thereto. For example, referring to FIG. 8B, the bank BNK may have a cross-section of a trapezoid, which is reduced in width upward. For example, the bank BNK may have, in an area bordering on the emission area EMA of each sub-pixel SPX, an inclined surface which is reduced in width upward. In this case, the angle ANG1 between the sidewall of the bank BNK and the upper surface of the first insulating layer INS1 may be 45° or more, for example, may be in a range from 70° to 90°.

For example, the bank BNK may have, in an area bordering on the emission area EMA of the sub-pixel SPX, a curved surface which is reduced in width upward. In other words, in an embodiment, the bank BNK may have a shape which is reduced in width upward, and the shape thereof may be changed in various ways.

Because the bank BNK has substantially a rectangular cross-sectional shape or the sidewall of the bank BNK is substantially perpendicular to the upper surface of the first insulating layer INS1, light emitted from each emission area EMA may be more effectively prevented from entering an adjacent emission area EMA and causing optical inference. Furthermore, the bank BNK may be more easily formed with a desired shape and/or height (e.g., a height of 2.5 μm or more) through the dry etching operation.

In some embodiments, the sidewall of the bank BNK may be disposed at the same plane as that of a sidewall of the conductive pattern CDP. As illustrated in FIGS. 8A and 8B, the sidewall of the bank BNK may correspond to the sidewall of the conductive pattern CDP.

In an embodiment, the bank BNK may completely overlap the conductive pattern CDP. As illustrated in FIG. 8A, in the case where the angle ANG1 of the bank BNK is substantially the right angle, the bank BNK may completely overlap the conductive pattern CDP. In a plan view, the conductive pattern CDP may not be exposed from the bank BNK, or may be covered with the bank BNK in a plan view.

In embodiments, the bank BNK may include a concave groove (or undercut) UC1 formed in a sidewall at a boundary surface between the bank BNK and the conductive pattern CDP. In the case where the bank BNK is formed through the dry etching operation, activated gas (e.g., plasma) may be reflected and moved in the same manner as that of a vortex on the boundary surface between the bank BNK and the conductive pattern CDP, whereby the concave groove UC1 may be formed in the sidewall of the bank BNK that borders on the conductive patterns CDP. Hence, the bank BNK may have a partially reverse tapered cross-sectional shape in the boundary surface bordering the conductive pattern CDP.

Likewise, the conductive pattern CDP may include, in the boundary surface bordering the bank BNK, a concave groove UC2 formed in the sidewall thereof. In the case where the conductive pattern CDP is formed through a wet etching process, the concave groove UC2 may be formed in the sidewall of the conductive pattern CDP that borders the bank BNK, depending on an etch selectivity of the conductive pattern CDP with respect to the bank BNK that functions as a mask.

Although FIG. 8A illustrates that the sidewall of the bank BNK and the sidewall of the conductive pattern CDP are aligned with each other or are continuous at the boundary surface of the bank BNK and the conductive pattern CDP, the present disclosure is not limited thereto. For example, as illustrated in FIG. 8B, the sidewall of the bank BNK may be disposed at a plane different from that of the sidewall of the conductive pattern CDP or may be discontinuous with the sidewall of the conductive pattern CDP. A first width of the bank may be greater than a second width of the conductive pattern at the boundary surface between the bank BNK and the conductive pattern CDP. In other words, depending on the etch selectivity of the conductive pattern CDP, the shape on the boundary surface between the bank BNK and the conductive pattern CDP may be changed in various ways.

Referring again to FIG. 7, the second insulating layer INS2 may be disposed over the light emitting elements LD aligned between the first and second electrodes ELT1 and ELT2, and may expose the first and second ends EP1 and EP2 of the light emitting elements LD. For example, the second insulating layer INS2 may be partially disposed only over some areas (e.g., set or predetermined areas) of the light emitting elements LD without covering the first and second ends EP1 and EP2 of the light emitting elements LD. The second insulating layer INS2 may be formed in an independent pattern on each emission area EMA, but the present disclosure is not limited thereto. Furthermore, as illustrated in FIG. 7, if space is present between the first insulating layer INS1 and the light emitting elements LD before the second insulating layer INS2 is formed, the space may be filled with the second insulating layer INS2. Consequently, the light emitting elements LD may be more stably supported.

The first and second contact electrodes CNE1 and CNE2 may be disposed on the first and second electrodes ELT1 and ELT2 and the first and second ends EP1 and EP2 of the light emitting elements LD. In an embodiment, the first and second contact electrodes CNE1 and CNE2 may be disposed on the same layer, as illustrated in FIG. 7. In this case, although the first and second contact electrodes CNE1 and CNE2 are formed through the same process using the same conductive material, the present disclosure is not limited thereto.

The first and second contact electrodes CNE1 and CNE2 may respectively electrically couple the first and second ends EP1 and EP2 of the light emitting elements LD to the first and second electrodes ELT1 and ELT2.

For example, the first contact electrode CNE1 may be disposed on the first electrode ELT1 to come into contact with the first electrode ELT1. For instance, the first contact electrode CNE1 may be disposed on one area (e.g., the first contactor) of the first electrode ELT1 that is not covered by the first insulating layer INS1, so that the first contact electrode CNE1 comes into contact with the first electrode ELT1. Furthermore, the first contact electrode CNE1 may be disposed on the first end EP1 of at least one light emitting element LD adjacent to the first electrode ELT1, e.g., on the respective first ends EP1 of a plurality of light emitting elements LD so that the first contact electrode CNE1 can come into contact with the first ends EP1. In other words, the first contact electrode CNE1 may be disposed to cover the first ends EP1 of the light emitting elements LD and at least one area of the corresponding first electrode ELT1. Hence, the first ends EP1 of the light emitting elements LD may be electrically coupled to the first electrode ELT1.

Likewise, the second contact electrode CNE2 may be disposed on the second electrode ELT2 to come into contact with the second electrode ELT2. For instance, the second contact electrode CNE2 may be disposed on one area (e.g., the second contactor) of the second electrode ELT2 that is not covered by the first insulating layer INS1, so that the second contact electrode CNE2 comes into contact with the second electrode ELT2. Furthermore, the second contact electrode CNE2 may be disposed on the second end EP2 of at least one light emitting element LD adjacent to the second electrode ELT2, e.g., on the second ends EP2 of a plurality of light emitting elements LD so that the second contact electrode CNE2 can come into contact with the second ends EP2. In other words, the second contact electrode CNE2 may be disposed to cover the second ends EP2 of the light emitting elements LD and at least one area of the corresponding second electrode ELT2. Hence, the second ends EP2 of the light emitting elements LD may be electrically coupled to the second electrode ELT2.

The third insulating layer INS3 may be formed and/or disposed on one surface of the base layer SUB1 on which the first and second bank patterns PW1 and PW2, the first and second electrodes ELT1 and ELT2, the first insulating layer INS1, the light emitting elements LD, the second insulating layer INS2, the first and second contact electrodes CNE1 and CNE2, the conductive pattern CDP, and the bank BNK are formed, so that the third insulating layer INS3 may cover the first and second bank patterns PW1 and PW2, the first and second electrodes ELT1 and ELT2, the first insulating layer INS1, the light emitting elements LD, the second insulating layer INS2, the first and second contact electrodes CNE1 and CNE2, the conductive pattern CDP, and the bank BNK. The third insulating layer INS3 may include a thin-film encapsulation layer including at least one inorganic layer and/or organic layer, but the present disclosure is not limited thereto. In some embodiments, at least one overcoat layer, which is not illustrated, may be further disposed over the third insulating layer INS3.

In an embodiment, each of the first to third insulating layers INS1, INS2, and INS3 may have a single-layer or multi-layer structure, and include at least one inorganic insulating material and/or organic insulating material. For example, each of the first to third insulating layers INS1, INS2, and INS3 may include various kinds of well-known organic/inorganic insulating materials as well as SiNx, and the constituent material of each of the first to third insulating layers INS1, INS2, and INS3 is not particularly limited. The first to third insulating layers INS1, INS2, and INS3 may include different insulating materials, or at least some of the first to third insulating layers INS1, INS2, and INS3 may include the same insulating material.

As described with reference to FIGS. 7-8B, because the display panel PNL (or the display device) includes the conductive pattern CDP, the lower structure may be prevented from being damaged by an etching operation (e.g., a dry etching operation) for forming the bank BNK, and residues in the emission area EMA may be removed during the process of forming the conductive pattern CDP. Furthermore, the display panel PNL (or the display device) includes the bank BNK having an etch profile angle which is substantially the right angle. Therefore, optical interference resulting from light emitted from the emission area EMA being drawn into an adjacent emission area EMA may be more effectively prevented or reduced. Furthermore, in the case where the bank BNK is formed through the dry etching operation, the shape and/or height (e.g., the height of 2.5 μm or more) of the bank BNK may be more easily controlled, and the bank BNK may have a desired shape and/or height.

Although in FIGS. 7-8B the bank BNK and the conductive pattern CDP have been illustrated as being components separated from each other, the present disclosure is not limited thereto. For example, the bank BNK may have a double- or multi-stacked structure (or a multilayer structure) including the conductive pattern CDP and at least one color bank layer (or a black bank layer) formed on the conductive pattern CDP.

Figure 9A:
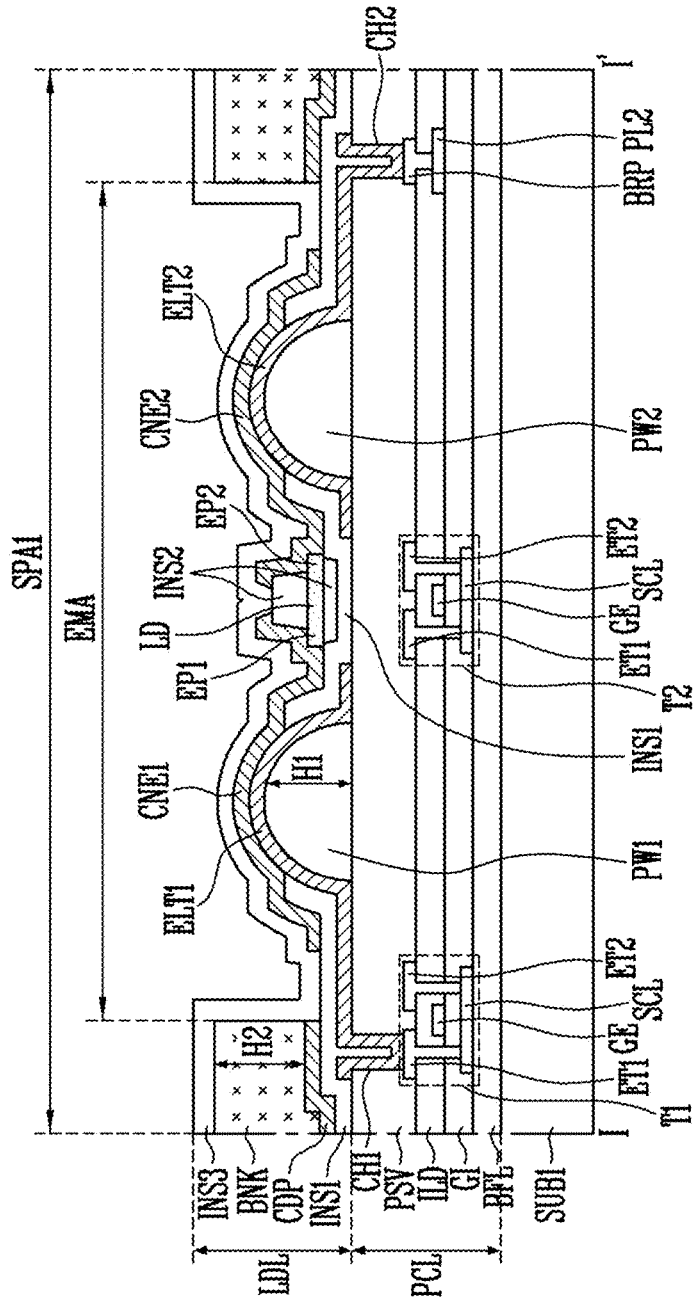
FIGS. 9A-9C are sectional views illustrating other examples of the sub-pixel, taken along the line I-I' of FIG. 6.
Figure 9B:
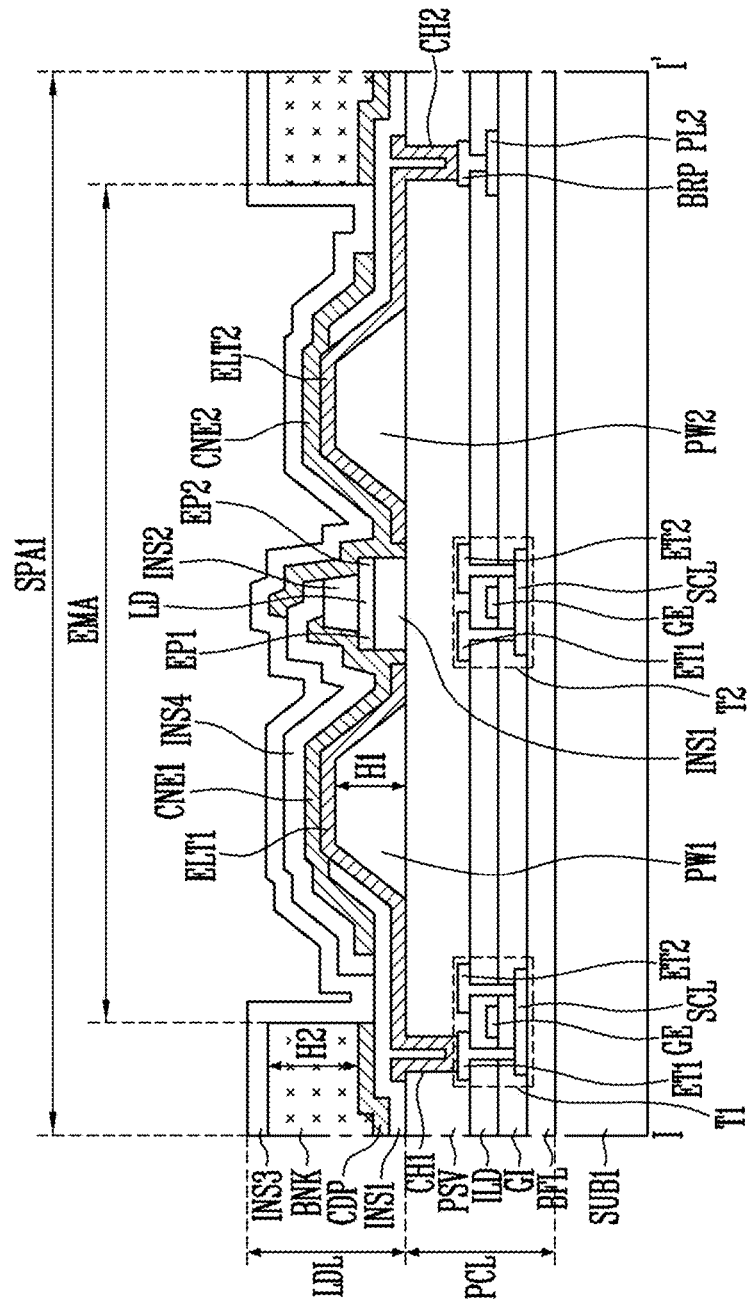
Figure 9C:
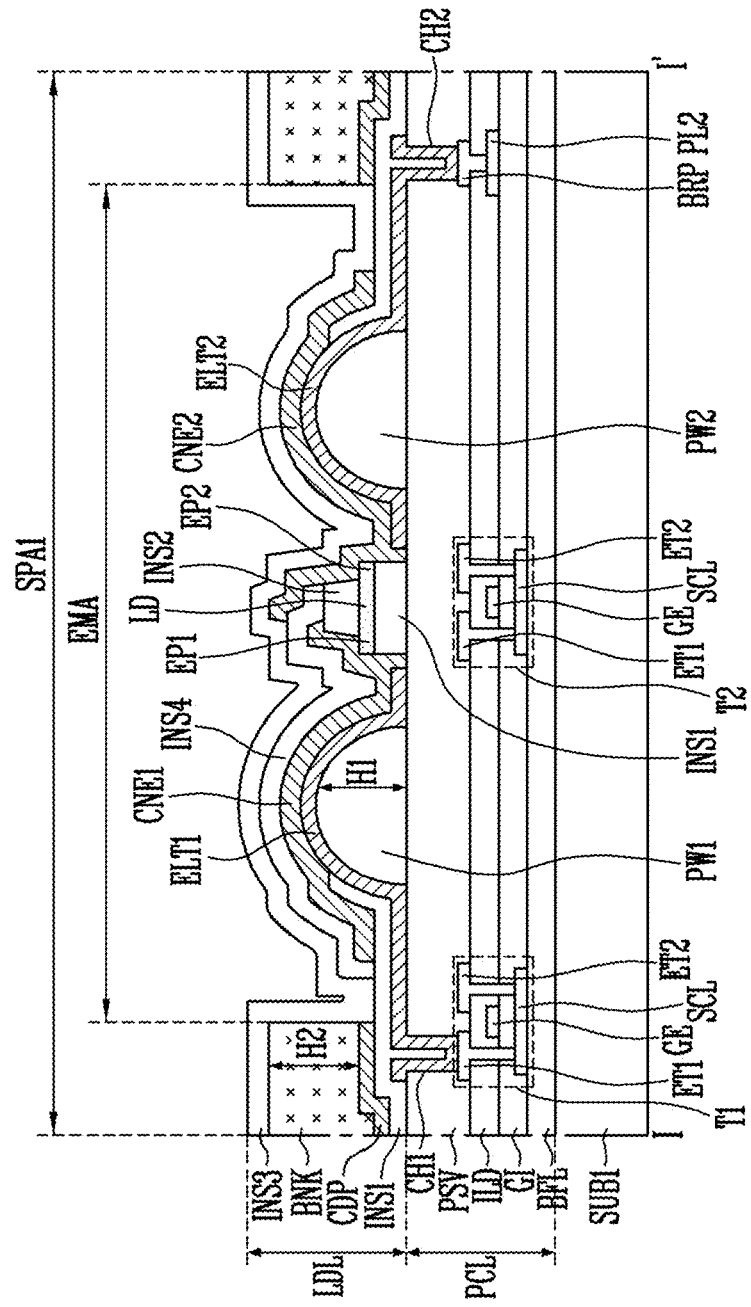

FIGS. 9A-9C are sectional views illustrating other examples of the sub-pixel taken along the line I-I' of FIG. 6. FIGS. 9A-9C illustrate cross-sections of a sub-pixel corresponding to the sub-pixel of FIG. 7.

Referring to FIGS. 7 and 9A, the sub-pixel of FIG. 9A may differ from the sub-pixel of FIG. 7 in that the sub-pixel of FIG. 9A includes first and second partitions walls PW1 and PW2 each having a semicircular or semielliptical cross-sectional shape. The sub-pixel of FIG. 9A, other than the first and second bank patterns PW1 and PW2, is substantially same or similar to the sub-pixel of FIG. 7, so that repetitive explanations will be omitted.

As illustrated in FIG. 9A, each of the first and second bank patterns PW1 and PW2 may have a cross-sectional shape of a semicircle that is reduced in width from a bottom to a top thereof. In this case, each of the first and second bank patterns PW1 and PW2 may have a curved surface on at least one side.

In other words, the shape of each of the first and second bank patterns PW1 and PW2 may be changed in various ways rather than being particularly limited. In an embodiment, at least one of the first and second bank patterns PW1 and PW2 may be omitted or changed in position. The first and second electrodes ELT1 and ELT2 may also have a semicircular or semielliptical cross-sectional shape in the areas overlapping the first and second bank patterns PW1 and PW2, as shown, for example, in FIG. 9A.

Referring to FIGS. 7 and 9B, the sub-pixel of FIG. 9B differs from the sub-pixel of FIG. 7 in that the sub-pixel of FIG. 9B includes first and second contact electrodes CNE1 and CNE2 disposed on different layers.

The first contact electrode CNE1 may be disposed in the sub-pixel area SPA in which the second insulating layer INS2 is disposed. In an embodiment, the first contact electrode CNE1 may be disposed on the first electrode ELT1 disposed in the corresponding sub-pixel area SPA such that the first contact electrode CNE1 comes into contact with one area of the first electrode ELT1. Furthermore, the first contact electrode CNE1 may be disposed on the first end EP1 of at least one light emitting element LD disposed in the corresponding sub-pixel area SPA such that that the first contact electrode CNE1 comes into contact with the first end EP1. Due to the first contact electrode CNE1, the first end EP1 of at least one light emitting element LD disposed in the sub-pixel area SPA may be electrically coupled to the first electrode ELT1 disposed in the corresponding sub-pixel area SPA.

A fourth insulating layer INS4 may be disposed in the sub-pixel area SPA in which the first contact electrode CNE1 is disposed. In an embodiment, the fourth insulating layer INS4 may cover the second insulating layer INS2 and the first contact electrode CNE1 that are disposed in the corresponding sub-pixel area SPA.

In an embodiment, the fourth insulating layer INS4 may have a single-layer or multilayer structure, and include at least one inorganic insulating material and/or organic insulating material, in a manner similar to that of the first to third insulating layers INS1, INS2, and INS3. For example, the fourth insulating layer INS4 may include various kinds of well-known organic/inorganic insulating materials as well as SiNx. Furthermore, the fourth insulating layer INS4 may include insulating material different from that of the first to third insulating layers INS1, INS2, and INS3, or may include the same insulating material as that of at least some of the first to third insulating layers INS1, INS2, and INS3.

The second contact electrode CNE2 may be disposed in each sub-pixel area SPA in which the fourth insulating layer INS4 is disposed. In an embodiment, the second contact electrode CNE2 may be disposed on the second electrode ELT2 disposed in the corresponding sub-pixel area SPA such that the second contact electrode CNE2 comes into contact with one area of the second electrode ELT2. Furthermore, the second contact electrode CNE2 may be disposed on the second end EP2 of at least one light emitting element LD disposed in the corresponding sub-pixel area SPA such that that the second contact electrode CNE2 comes into contact with the second end EP2. Due to the second contact electrode CNE2, the second end EP2 of at least one light emitting element LD disposed in each sub-pixel area SPA may be electrically coupled to the second electrode ELT2 disposed in the corresponding sub-pixel area SPA. In the embodiment of FIG. 9B, the second contact electrode CNE2 may overlap the second insulating layer INS2 and the fourth insulating layer INS4 on the light emitting element LD. For example, the fourth insulating layer INS4 may be disposed between the first contact electrode CNE1 and the second contact electrode CNE2 to insulate the first contact electrode CNE1 from the second contact electrode CNE2.

The third insulating layer INS3 may be formed and/or disposed on one surface of the base layer SUB1 on which the first and second bank patterns PW1 and PW2, the first and second electrodes ELT1 and ELT2, the light emitting elements LD, the first and second contact electrodes CNE1 and CNE2, the first, second, and fourth insulating layers INS1, INS2, and INS4, and the conductive pattern CDP, are formed, so that the third insulating layer INS3 may cover the first and second bank patterns PW1 and PW2, the first and second electrodes ELT1 and ELT2, the light emitting elements LD, the first and second contact electrodes CNE1 and CNE2, the first, second, and fourth insulating layers INS1, INS2, and INS4, the conductive pattern CDP, and the bank BNK.

Referring to FIGS. 9B and 9C, the sub-pixel of FIG. 9C may differ from the sub-pixel of FIG. 9B in that the sub-pixel of FIG. 9C includes first and second partitions walls PW1 and PW2 each having a semicircular or semielliptical cross-sectional shape.

As illustrated in FIG. 9C, each of the first and second bank patterns PW1 and PW2 may have a cross-sectional shape of a semicircle that is reduced in width from a bottom to a top thereof. In this case, each of the first and second bank patterns PW1 and PW2 may have a curved surface on at least one side.

Figure 10:
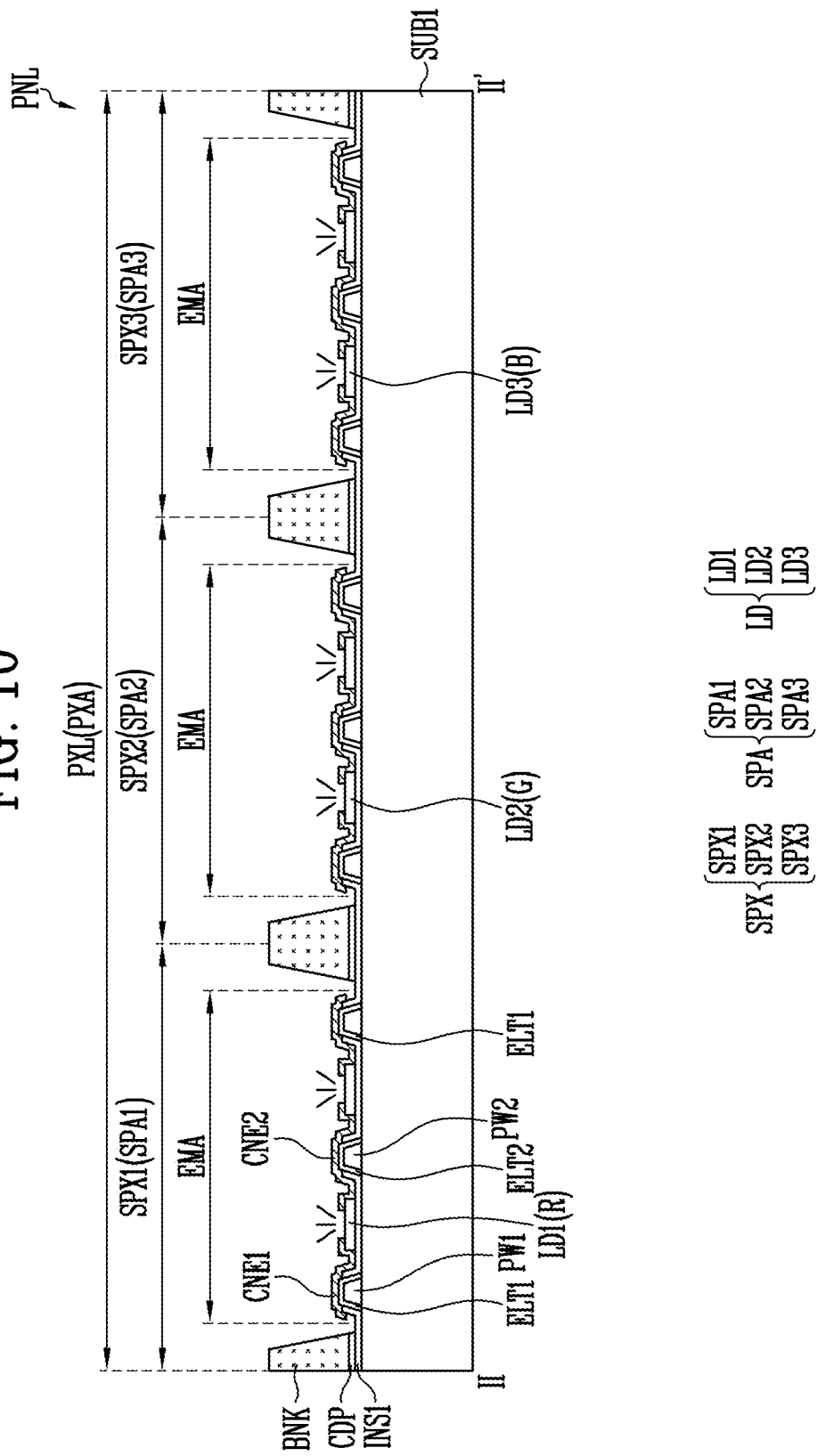
FIG. 10 is a sectional view illustrating an example of the pixel, taken along the line II-II' of FIG. 6.

FIG. 10 is a sectional view illustrating an example of the pixel, taken along the line II-II' of FIG. 6. For the sake of explanation, FIG. 10 schematically illustrates some components such as the pixel circuit layer PCL (and the base layer SUB1) described in detail with reference to FIG. 7, and detailed explanation thereof will be omitted.

Referring to FIGS. 6 and 10, the emission area EMA of the first sub-pixel SPX1, the emission area EMA of the second sub-pixel SPX2, and the emission area EMA of the third sub-pixel SPX3 may be defined by the bank BNK (and the conductive pattern CDP).

The first light emitting element LD1 may be disposed in the emission area EMA of the first sub-pixel SPX1. The second light emitting element LD2 may be disposed in the emission area EMA of the second sub-pixel SPX2. The third light emitting element LD3 may be disposed in the emission area EMA of the third sub-pixel SPX3. Here, the first light emitting element LD1 may be a red light emitting diode configured to emit red light. The second light emitting element LD2 may be a green light emitting diode configured to emit green light. The third light emitting element LD3 may be a blue light emitting diode configured to emit blue light. In this case, the display panel PNL (or the display device) may display a full-color image.

The bank BNK may block light emitted from the light emitting elements LD of each sub-pixel SPX from passing through the bank BNK, thus preventing or reducing optical interference that may result from the light emitted from each emission area EMA being drawn into an adjacent emission area EMA.

The light emitting elements LD may emit light having colors different from each other. The bank BNK may block optical inference between the adjacent emission areas EMA. Hence, a separate color filter, a black matrix, etc. may not be needed. Consequently, the structure of the display panel PNL (or the display device) may be simplified, and the thickness hereof may be reduced.

FIGS. 11A-11E are sectional views illustrating an example of a process of fabricating the sub-pixel of FIG. 7. FIGS. 11A-11E illustrate some operations of the process of fabricating the sub-pixel before supply of light emitting elements. FIGS. 11A-11E schematically illustrate the structure of the pixel circuit layer PCL described in detail in FIG. 7, based on some components thereof, and detailed description thereof will be omitted.

Figure 11A:
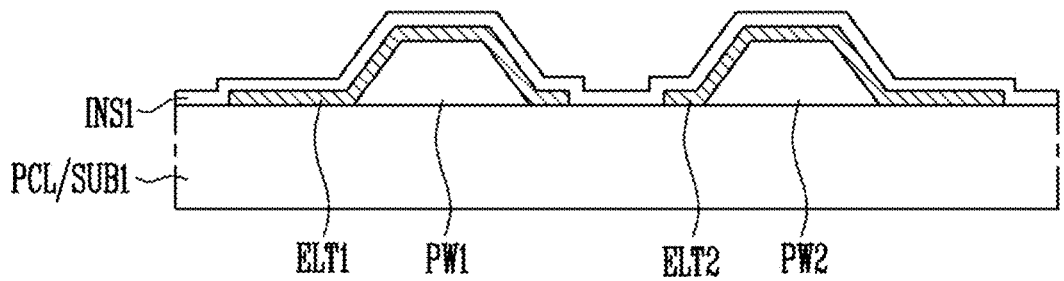
FIGS. 11A-11E are sectional views illustrating an example of a process of fabricating the sub-pixel of FIG. 7.

Referring to FIG. 11A, the pixel circuit layer PCL (or the base layer SUB1) may be prepared.

The first and second bank patterns PW1 and PW2 may be formed on the pixel circuit layer PCL. As described with reference to FIG. 7, the first and second bank patterns PW1 and PW2 may be disposed at positions that are spaced from each other in the emission area EMA.

The first and second electrodes ELT1 and ELT2 may be respectively formed over the first and second bank patterns PW1 and PW2. The first and second electrodes ELT1 and ELT2 may be spaced from each other. The first electrode ELT1 may overlap the first bank pattern PW1 and cover the first bank pattern PW1. The second electrode ELT2 may overlap the second bank pattern PW2 and cover the second bank pattern PW2.

The first insulating layer INS1 may be formed on the first and second electrodes ELT1 and ELT2 and the pixel circuit layer PCL. The first insulating layer INS1 may be disposed on an overall surface of the pixel circuit layer PCL to cover the pixel circuit layer PCL that is exposed from the first and second electrodes ELT1 and ELT2.

Figure 11B:
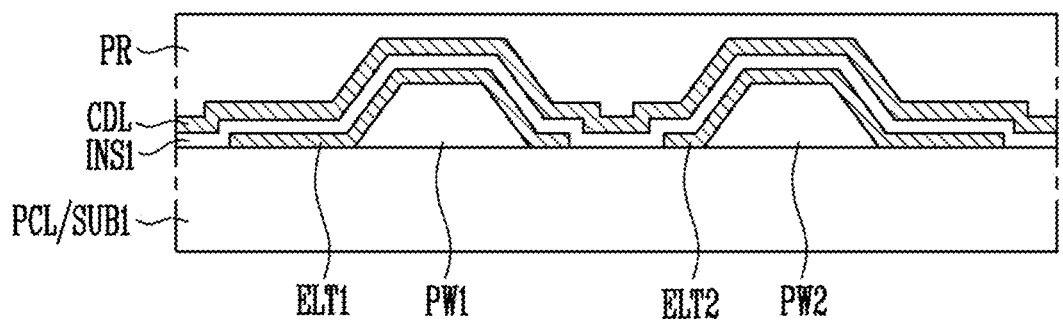

Referring to FIG. 11B, the conductive layer CDL may be formed on the first insulating layer INS1. The conductive layer CDL may be disposed on an overall surface of the first insulating layer INS1. The conductive layer CDL may include the conductive pattern CDP described with reference to FIG. 7. The conductive pattern CDP may be formed by patterning the conductive layer CDL after the light emitting elements LD are supplied and aligned.

A light shielding layer PR (or a photoresist layer) may be formed on the conductive layer CDL. Light shielding material (or photoresist) may be coated on the conductive layer CDL, and the light shielding layer PR may be formed through a hard bake process. The light shielding layer PR may include the bank BNK described with reference to FIG. 7. The thickness of the light shielding layer PR may be determined by a coating thickness. In other words, the height of the bank BNK may be easily adjusted by adjusting the coating thickness.

Figure 11C:
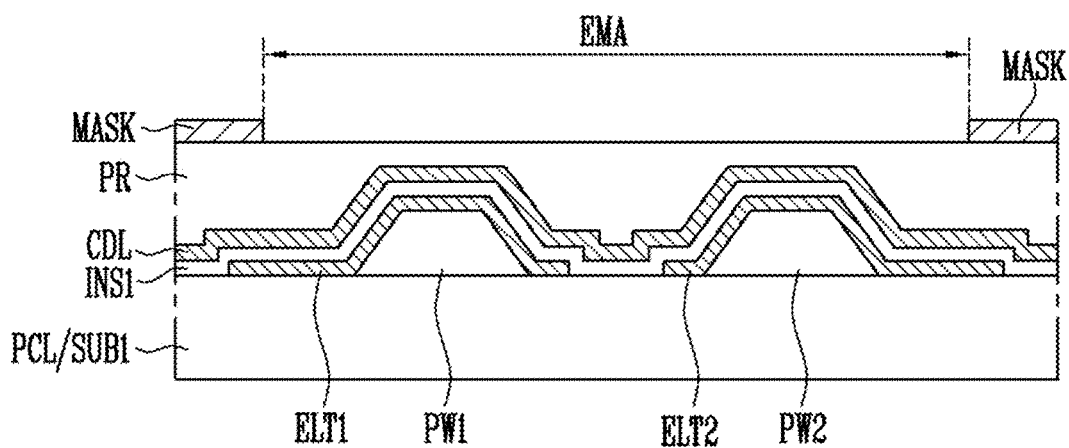

Referring to FIG. 11C, a mask MASK may be formed on the light shielding layer PR. The mask MASK may be patterned through a photo process. The mask MASK may be disposed in a shape to enclose the emission area EMA, and have substantially the same plan shape as the conductive pattern CDP and/or the bank BNK described with reference to FIG. 7.

In some embodiments, the mask MASK may include the same material as that of the conductive layer CDL, and have the same thickness as that of the conductive layer CDL. The mask MASK may include transparent conductive material in a manner similar to that of the conductive pattern CDP, and for example, may include indium tin oxide (ITO), indium zinc oxide (IZO), aluminum-doped zinc oxide (AZO), gallium indium zinc oxide (GIZO), zinc oxide (ZnO), or a combination thereof. Furthermore, the thickness of the mask MASK may be 2000 Å or less or 1000 Å or less in a manner similar to that of the conductive pattern CDP.

Figure 11D:
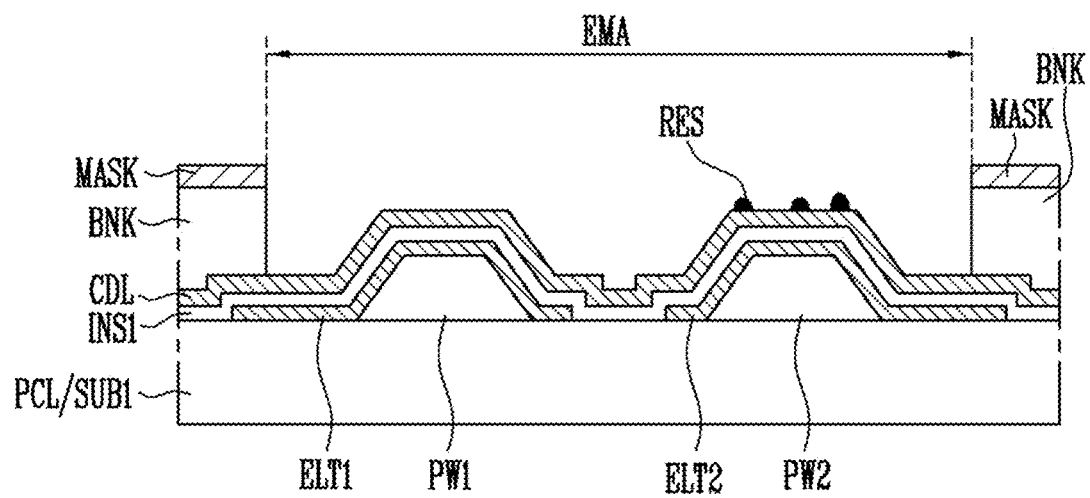

Referring to FIG. 11D, a portion of the light shielding layer PR that is exposed from the mask MASK (i.e., a portion of the light shielding layer PR disposed on the emission area EMA) is removed by dry-etching, whereby the bank BNK can be formed.

Because the conductive layer CDL is disposed under the light shielding layer PR, the first insulating layer INS1 and/or the first and second electrodes ELT1 and ELT2 in the emission area EMA may be prevented from being damaged by the dry-etching operation.

As illustrated in FIG. 11D, residues RES of the light shielding layer PR may be present in the emission area EMA. For reference, black matrix material such as carbon black has been developed for patterning on glass (or bare glass), so that if a layer under the light shielding layer PR is not formed of glass, a large amount of residues RES may be formed. Therefore, in the method of fabricating the display device in some embodiments of the present disclosure, residues RES in the emission area EMA may be removed by forming the separate conductive layer CDL under the light shielding layer PR, and removing the conductive layer CDL after the bank BNK has been formed.

Figure 11E:
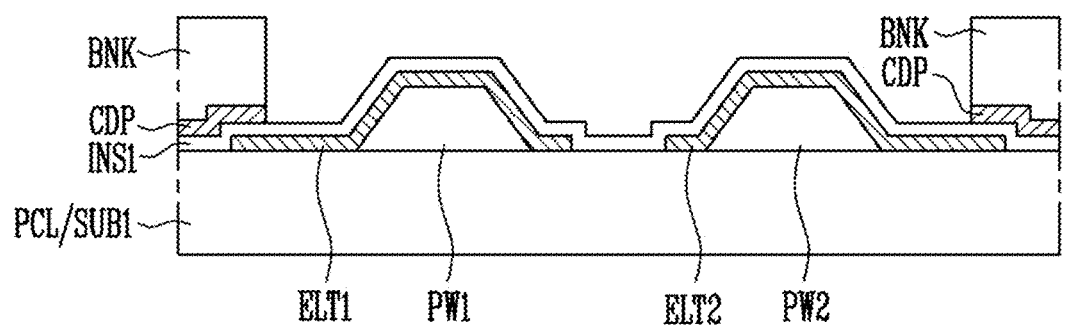

Referring to FIGS. 11D and 11E, the conductive pattern CDP may be formed by removing the mask MASK and a portion of the conductive layer CDL that is exposed from the bank BNK (i.e., a portion of the conductive layer CDL disposed in the emission area EMA) through a wet etching operation.

While the portion of the conductive layer CDL disposed in the emission area EMA is removed, the residues RES of the light shielding layer PR may be removed.

As described with reference to FIGS. 11A-11E, in the method of fabricating the display device, because the conductive layer CDL is formed under the light shielding layer PR (or the bank BNK), the lower structure may be protected from the dry etching operation for forming the bank BNK. Furthermore, in the method of fabricating the display device, residues RES of the light shielding layer PR in the emission area EMA may be removed by removing the conductive layer CDL in the emission area EMA after the bank BNK has been formed. Thus, defects resulting from the residues RES (e.g., a short-circuit, or defective alignment of the light emitting elements LD caused by residues) can be prevented from occurring.

Figure 12A:
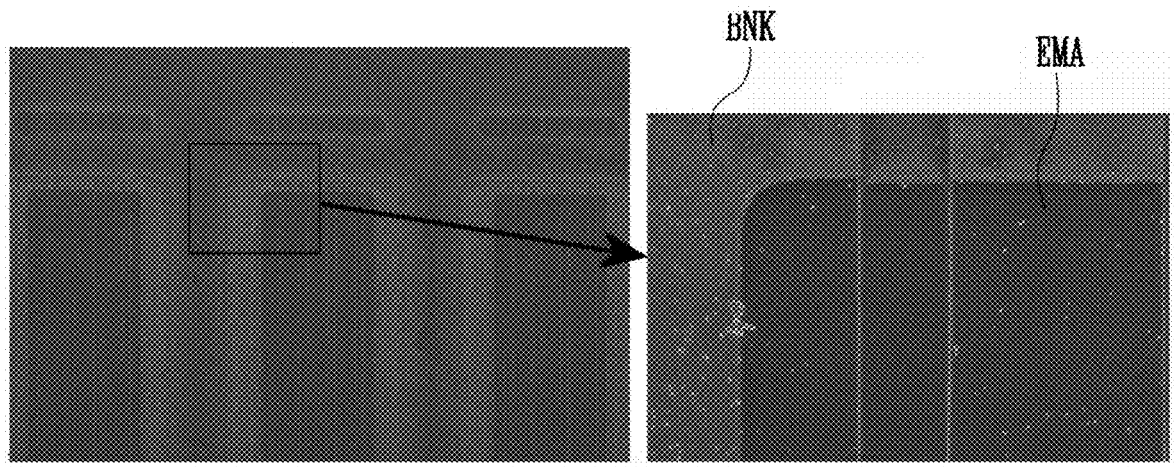
FIG. 12A is an electron microscope image illustrating a comparative example of the pixel of FIG. 6.
Figure 12B:
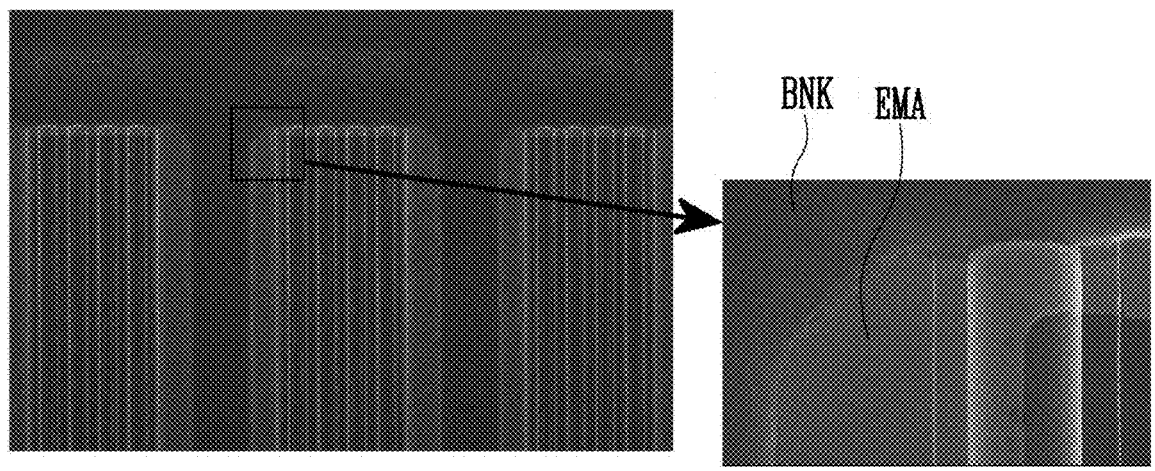
FIG. 12B is an electron microscope image illustrating an example of the pixel of FIG. 6.

FIG. 12A is an electron microscope image illustrating a comparative example of the pixel of FIG. 6. FIG. 12B is an electron microscope image illustrating an example of the pixel of FIG. 6.

Referring to FIG. 12A, there is illustrated a plan view of a pixel including the bank BNK formed of black matrix material such as carbon block without including the conductive layer CDL described with reference to FIG. 11B.

As illustrated in FIG. 12A, a large number of residues of the bank BNK (or the light shielding layer PR) may be present in the emission area EMA. The residues may cause a short-circuit defect in the sub-pixel SPX or induce a black spot defect, thus deteriorating the image quality.

Referring to FIG. 12B, there is illustrated a plan view of a pixel including the bank BNK formed through the processes of FIGS. 11A-11E.

As illustrated in FIG. 12B, residues of the bank BNK (or the light shielding layer PR) may not be present in the emission area EMA, or the amount of residues may be markedly reduced compared to that of the embodiment of FIG. 12A.

Figure 13A:
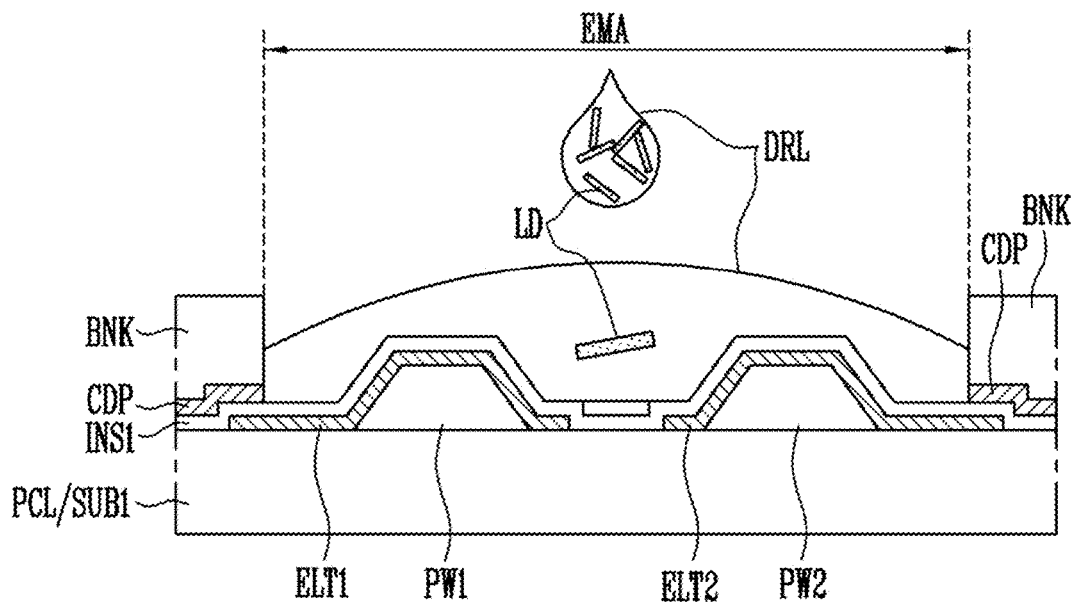
FIGS. 13A and 13B are sectional views illustrating an example of a process of aligning a light emitting element in the sub-pixel of FIG. 7.
Figure 13B:
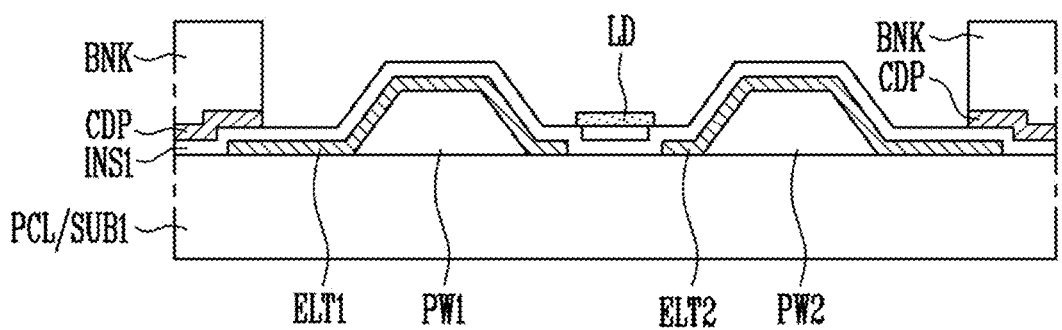
Figure 14A:
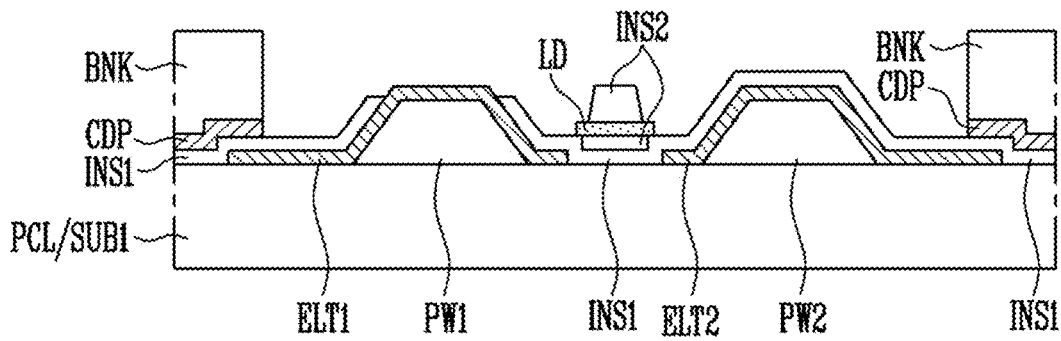
FIGS. 14A-14C are sectional views illustrating an example of a process of fabricating the sub-pixel of FIG. 7.
Figure 14B:
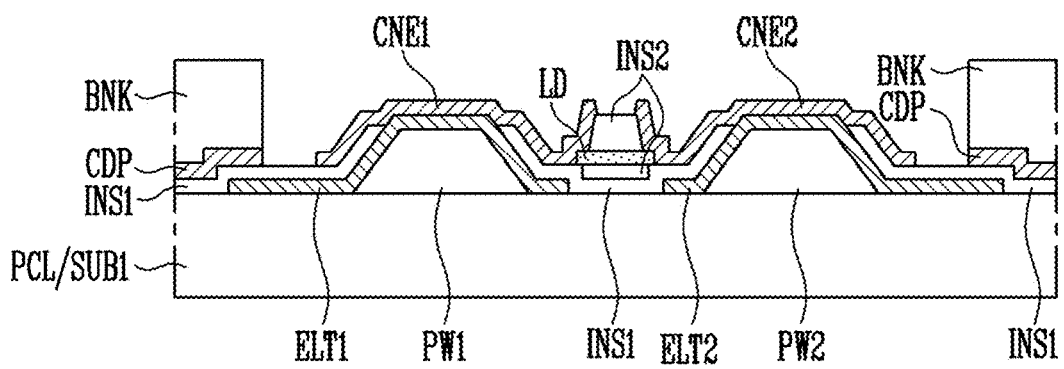
Figure 14C:
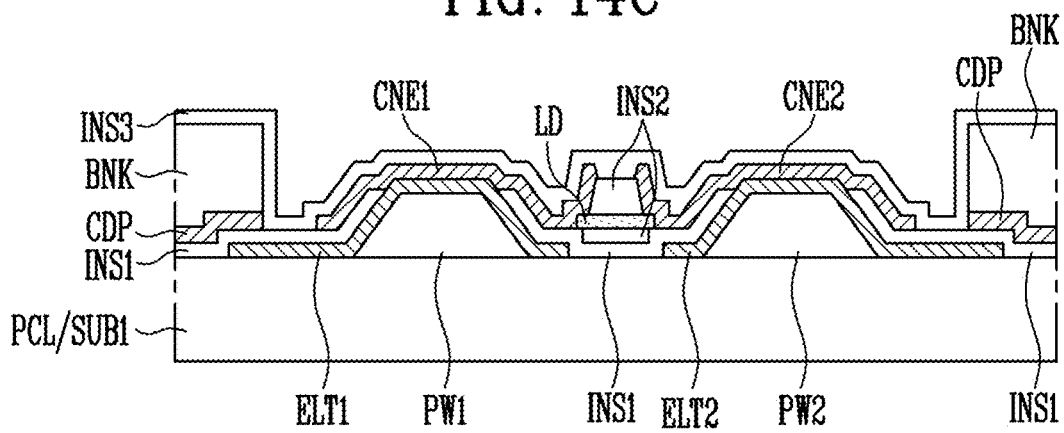

FIGS. 13A and 13B are sectional views illustrating an example of a process of aligning a light emitting element LD in the sub-pixel of FIG. 7. FIGS. 14A-14C are sectional views illustrating an example of a process of fabricating the sub-pixel of FIG. 7. FIGS. 13A and 13B illustrate a process of supplying and aligning the light emitting elements LD during a process of fabricating the sub-pixel. FIGS. 14A-14C illustrate a portion of the process of fabricating the sub-pixel after the light emitting elements are aligned. FIGS. 13A-14C schematically illustrate the structure of the pixel circuit layer PCL described in detail in FIG. 7, based on some components thereof, and detailed description thereof will be omitted.

Referring to FIG. 13A, after the bank BNK (and the conductive pattern CDP) is formed, the light emitting elements LD may be supplied to or disposed in the emission area EMA. The light emitting elements LD may be dispersed in a solution DRL (e.g., a set or predetermined solution DRL) (or solvent) and supplied to each emission area EMA through an inkjet scheme or the like. However, the scheme of supplying the light emitting elements LD is not limited the foregoing scheme, and the light emitting elements LD may be supplied to the emission area EMA in various other ways.

Thereafter, alignment voltages are applied to the first and second electrodes ELT1 and ELT2, so that an electric field may be formed between the first and second electrodes ELT1 and ELT2 in the emission area EMA. Consequently, the light emitting elements LD may be self-aligned between the first and second electrodes ELT1 and ELT2 of the emission area EMA.

A ground voltage GND may be applied to the first electrode ELT1, and an alternating current voltage AC may be applied to the second electrode ELT2. Alternatively, the alternating current voltage AC may be applied to the first electrode ELT1, and the ground voltage GND may be applied to the second electrode ELT2.

The steps of supplying and aligning the light emitting elements LD may be successively performed or concurrently performed (e.g., simultaneously performed). For example, the light emitting elements LD may be aligned by supplying the alignment voltages to the first electrode ELT1 and the second electrode ELT2 of the emission area EMA concurrently (e.g., simultaneously) with the supply of the light emitting elements LD to the emission area EMA. For example, the light emitting elements LD may be aligned by supplying the alignment voltages to the first electrode ELT1 and the second electrode ELT2 of the emission area EMA after the light emitting elements LD are supplied to the emission area EMA. In other words, the sequence and/or scheme of the steps of supplying and aligning the light emitting elements LD is not particularly limited.

Referring to FIG. 13B, after the light emitting elements LD have been aligned, the solvent DRL may be removed by a volatilization scheme or other schemes. In this way, the light emitting elements LD may be reliably arranged between the first electrode ELT1 and the second electrode ELT2.

Referring to FIG. 14A, the second insulating layer INS2 may be formed over the light emitting elements LD, for example, the light emitting elements LD aligned between the first and second electrodes ELT1 and ELT2. The second insulating layer INS2 may be charged into a space between the first insulating layer INS1 and each of the light emitting elements LD.

The first and second ends EP1 and EP2 of the light emitting elements LD may be exposed by partially patterning the second insulating layer INS2. Furthermore, when the second insulating layer INS2 is patterned, the first insulating layer INS1 may be partially removed, as illustrated in FIG. 14A. In this case, the first and second electrodes ELT1 and ELT2 may be exposed.

Referring to FIG. 14B, the first and second contact electrodes CNE1 and CNE2 may be disposed on the first and second electrodes ELT1 and ELT2 and the first and second ends EP1 and EP2 of the light emitting elements LD, respectively. The first and second contact electrodes CNE1 and CNE2 are disposed on the same layer through the same process using the same conductive material.

The first and second contact electrodes CNE1 and CNE2 may respectively electrically couple the first and second ends EP1 and EP2 of the light emitting elements LD to the first and second electrodes ELT1 and ELT2.

Referring to FIG. 14C, the third insulating layer INS3 may be formed on one surface of the base layer SUB1 on which the first and second bank patterns PW1 and PW2, the first and second electrodes ELT1 and ELT2, the light emitting elements LD, the first and second contact electrodes CNE1 and CNE2, the first and second insulating layer INS1 and INS2, and the bank BNK are formed, so that the third insulating layer INS3 may cover the first and second bank patterns PW1 and PW2, the first and second electrodes ELT1 and ELT2, the light emitting elements LD, the first and second contact electrodes CNE1 and CNE2, the first and second insulating layer INS1 and INS2, and the bank BNK.

Although with reference to FIGS. 14A-14C there has been described the case where the first and second contact electrodes CNE1 and CNE2 are formed on the same layer through the same process, the present disclosure is not limited thereto. As described with reference to FIGS. 9B and 9C, after the second insulating layer INS2 is formed, the first contact electrode CNE1, the fourth insulating layer INS4, and the second contact electrode CNE2 may be successively formed.

FIGS. 15A-15D are sectional views illustrating other examples of the sub-pixel, taken along the line I-I' of FIG. 6. FIGS. 15A-15D illustrate cross-sections of a sub-pixel corresponding to the sub-pixel of FIG. 7.

Figure 15A:
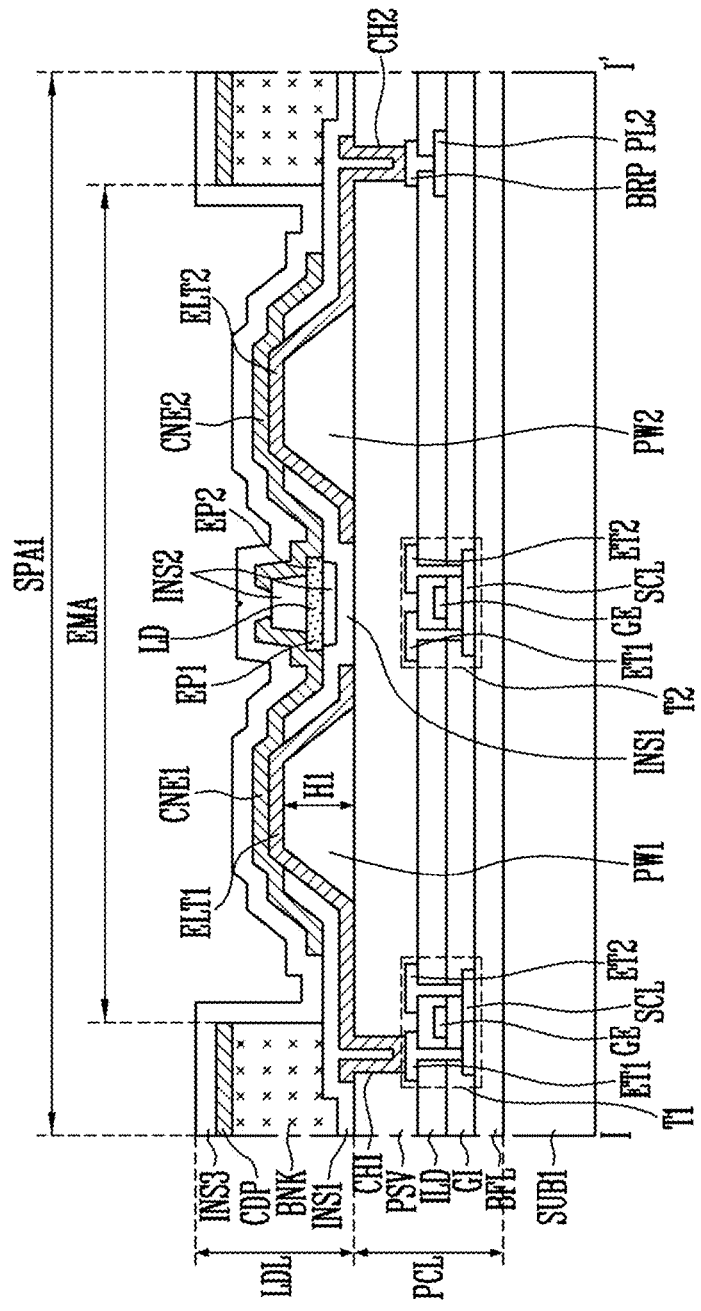
FIGS. 15A-15D are sectional views illustrating other examples of the sub-pixel, taken along the line I-I' of FIG. 6.

Referring to FIGS. 7 and 15A, the sub-pixel of FIG. 15A differs from the sub-pixel of FIG. 7 in that the sub-pixel of FIG. 15A includes the conductive pattern CDP disposed on the bank BNK. The sub-pixel of FIG. 15A, other than the disposition of the bank BNK and the conductive pattern CDP, is substantially equal or similar to the sub-pixel of FIG. 7, so that repetitive explanations will be omitted.

As illustrated in FIG. 15A, the bank BNK may be directly disposed on the first insulating layer INS1. As described with reference to FIG. 7, the bank BNK may be formed between the sub-pixels SPX to enclose the respective emission areas EMA of the sub-pixels SPX, so that a pixel defining layer for defining the emission area EMA of the sub-pixel SPX may be formed.

The conductive pattern CDP may be disposed on the bank BNK. The conductive pattern CDP may be formed between the sub-pixels SPX to enclose the respective emission area EMA of the sub-pixels SPX, and may overlap the bank BNK in a thickness direction, and completely overlap the bank BNK.

The conductive pattern CDP may function as a mask. The bank BNK may be formed through a dry etching operation. As described with reference to FIG. 8A, the bank BNK may have a rectangular cross-sectional shape, or the etch profile angle of the bank BNK may be substantially the right angle. However, the present disclosure is not limited thereto. As described with reference to FIG. 8B, the bank BNK may have a trapezoidal cross-sectional shape or a curved shape, and the etch profile angle thereof may be 45° or more, for example, range from 70° to 90°.

In some embodiments, the bank BNK may have color filter material. As described with reference to FIG. 7, in the case where the bank BNK include color filter material, residues of the bank BNK may be prevented from occurring compared to the case where black matrix material such as carbon block is used.

Figure 15B:
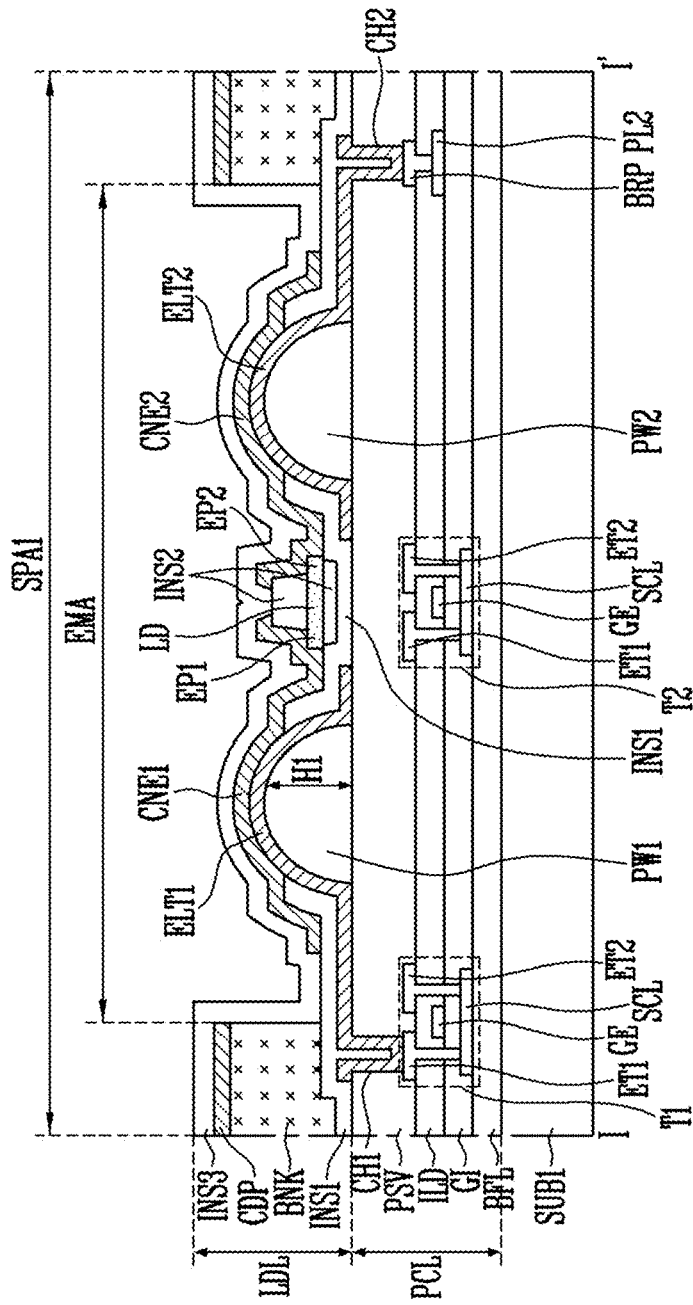
Figure 15C:
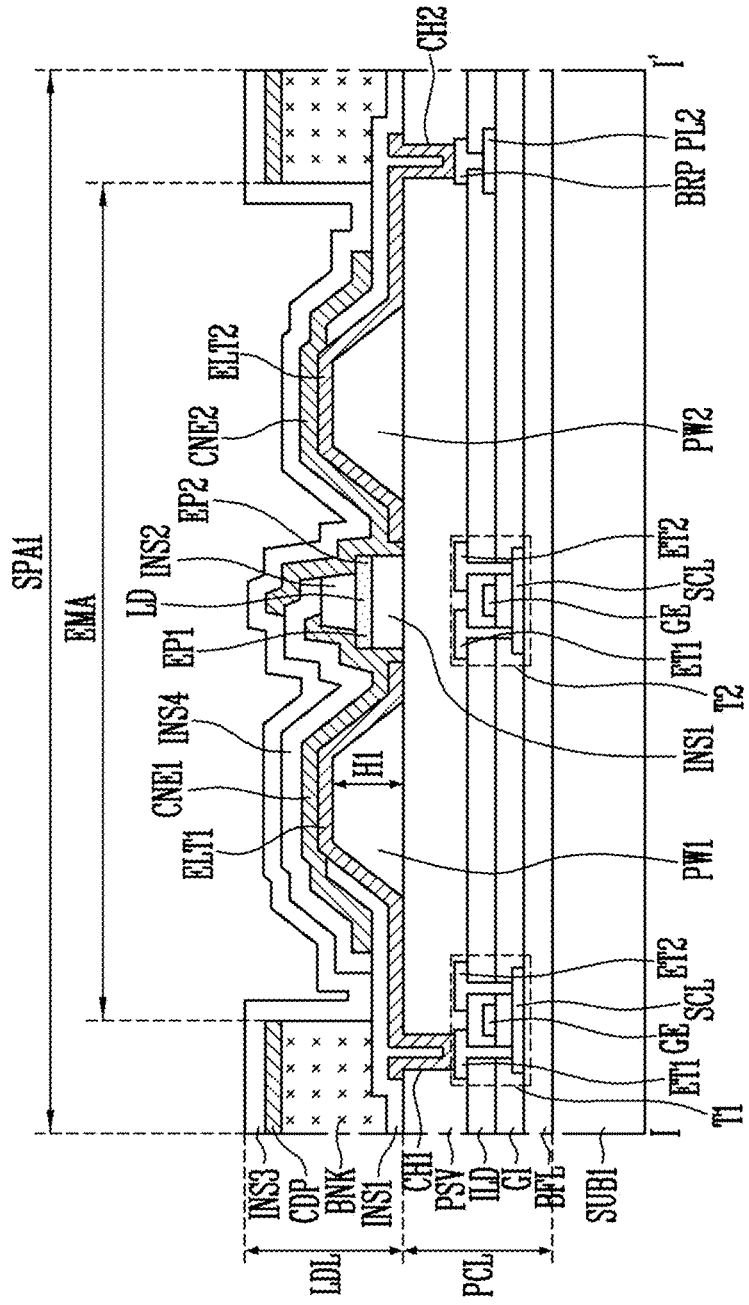
Figure 15D:
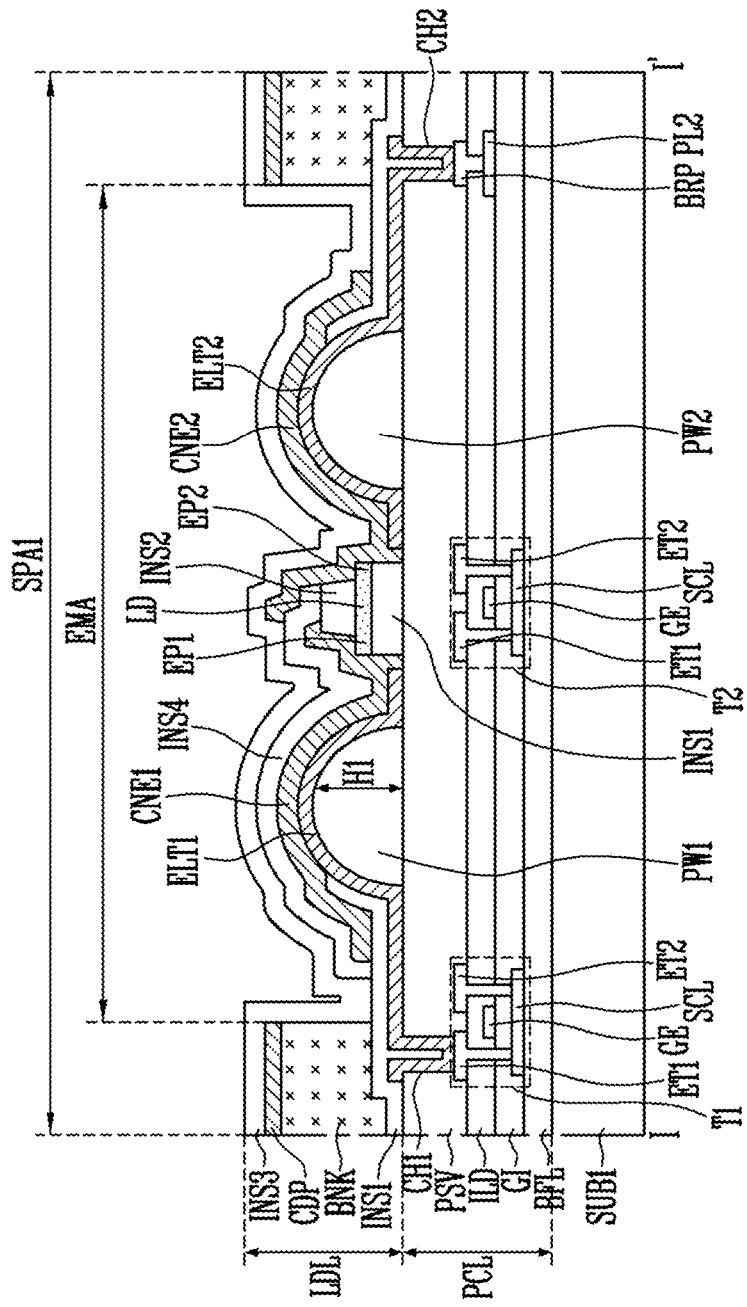

The sub-pixel may include first and second bank patterns PW1 and PW2 having various shapes. As illustrated in FIGS. 15A and 15C, each of the first and second bank patterns PW1 and PW2 may have a trapezoidal cross-sectional shape which is reduced in width upward. Alternatively, as illustrated in FIGS. 15B and 15D, each of the first and second bank patterns PW1 and PW2 may have a semicircular or semielliptical cross-sectional shape which is reduced in width upward.

Furthermore, the sub-pixel may include first and second contact electrodes CNE1 and CNE2 which are disposed on identical (e.g., same) or different layers. As illustrated in FIGS. 15A and 15B, the first and second contact electrodes CNE1 and CNE2 may be formed on the same layer through the same process. As illustrated in FIGS. 15C and 15D, the first and second contact electrodes CNE1 and CNE2 may be successively formed on different layers through different processes.

As described with reference to FIGS. 15A-15D, the display panel PNL (or the display device) includes the bank BNK having an etch profile angle which is substantially the right angle. Therefore, optical interference resulting from that light emitted from the emission area EMA being drawn into an adjacent emission area EMA may be more effectively prevented or reduced. Furthermore, in the case where the bank BNK is formed through the dry etching operation, the shape and/or height (e.g., the height of 2.5 μm or more) of the bank BNK may be more easily controlled.

FIGS. 16A-16D are sectional views illustrating an example of a process of fabricating the sub-pixel of FIG. 15A. FIGS. 16A-16D illustrate some operations of the process of fabricating the sub-pixel until alignment of the light emitting elements. Furthermore, the operations of FIGS. 16A-16D, other than the operation of forming the conductive layer CDL of FIG. 11B, are substantially equal (e.g., same) or similar to the operations described with reference to FIGS. 11A-11E, 12A, and 12B, so that repetitive explanations thereof will be skipped.

FIGS. 16A-16D schematically illustrate the structure of the above-described pixel circuit layer PCL, based on some components thereof, and detailed description thereof will be omitted.

Figure 16A:
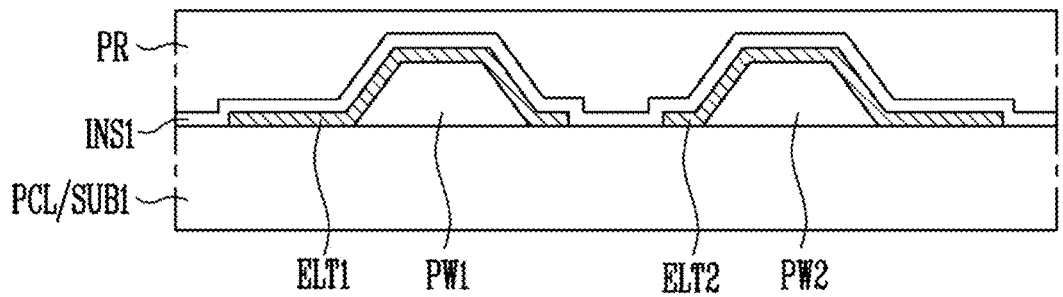
FIGS. 16A-16D are sectional views illustrating an example of a process of fabricating the sub-pixel of FIG. 15A.

Referring to FIG. 16A, the first and second bank patterns PW1 and PW2 may be formed on the pixel circuit layer PCL (or the base layer SUB1). The first and second electrodes ELT1 and ELT2 may be respectively formed on the first and second bank patterns PW1 and PW2. The first insulating layer INS1 may be formed on the first and second electrodes ELT1 and ELT2 and the pixel circuit layer PCL.

Subsequently, the light shielding layer PR (or a photoresist layer) may be formed on the first insulating layer INS1.

Figure 16B:
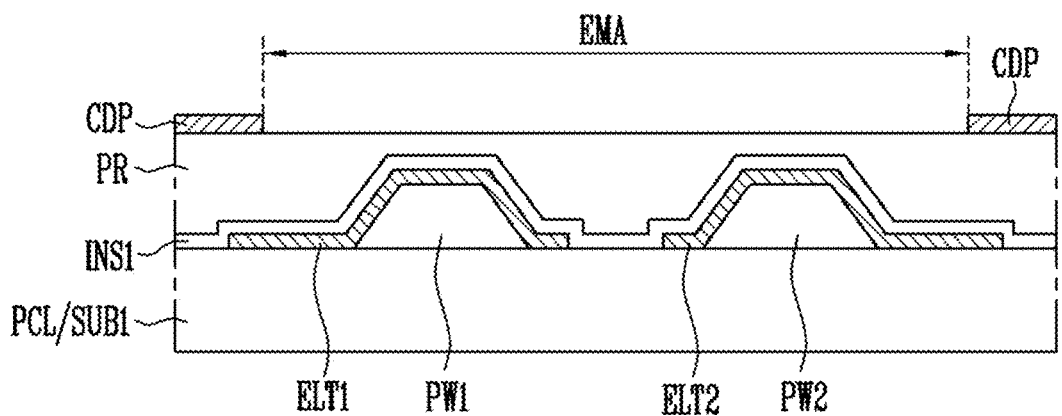

Referring to FIG. 16B, a mask (e.g., the conductive pattern CDP) may be formed on the light shielding layer PR. The mask (e.g., the conductive pattern CDP) may be disposed to enclose the emission area EMA.

Figure 16C:
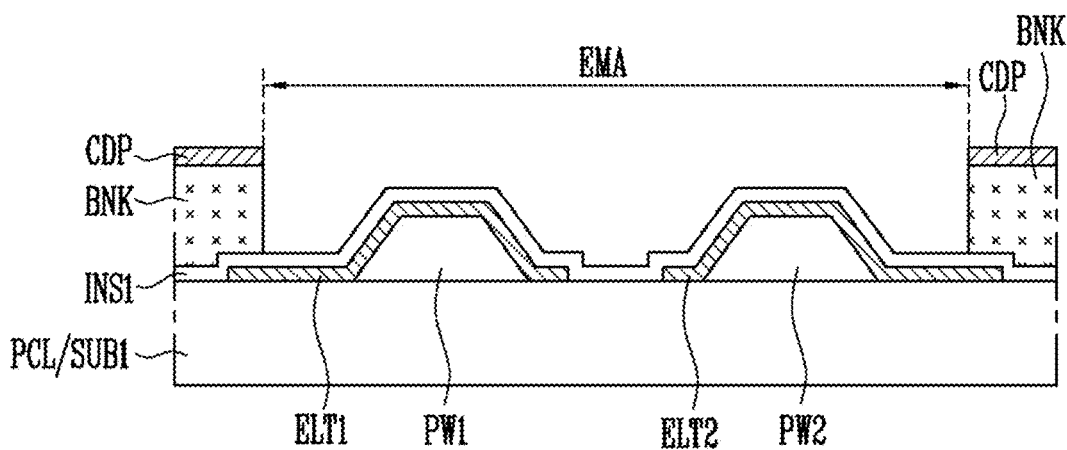

Referring to FIG. 16C, a portion of the light shielding layer PR that is exposed from the mask (e.g., the conductive pattern CDP) (i.e., a portion of the light shielding layer PR disposed on the emission area EMA) is removed by dry-etching, whereby the bank BNK can be formed.

Although residues RES of the light shielding layer PR may be present in the emission area EMA, the residues RES may be reduced because the light shielding layer PR is formed of color filter material.

Figure 16D:
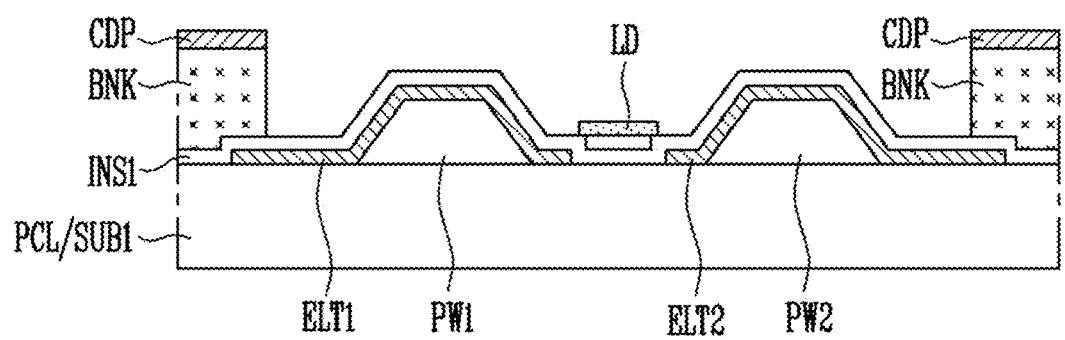

Referring to FIG. 16D, after the bank BNK (and the conductive pattern CDP) is formed, the light emitting elements LD may be supplied to or disposed in the emission area EMA.

After the operation of FIG. 16D, the operations of FIGS. 14A-14C may be used.

As described with reference to FIGS. 16A-16D, in the method of fabricating the display device, the bank BNK is formed through the dry-etching process rather than using a photo process, so that the etch profile angle of the bank BNK may be controlled to be 45° or more or within a range from 70° to 90°. Furthermore, the thickness of the bank BNK may be easily controlled by adjusting the coating thickness of the light shielding layer PR.

As described above, the display device according to various embodiments of the present disclosure may include the bank BNK enclosing each emission area EMA in which at least one light emitting element LD is disposed.

For example, in some embodiments of the present disclosure, the bank BNK is formed through the dry-etching process rather than using a photo process, so that the bank BNK having a desired profile angle (e.g., 70° or more) and a desired thickness (e.g., 2.5 μm or more) can be easily formed. The bank BNK may prevent light from leaking from the emission area EMA in a sideway direction, so that a color mixing phenomenon may be prevented from occurring between adjacent sub-pixels SPX.

Furthermore, because in some embodiments, the conductive pattern CDP (or the conductive layer CDL) is formed under the bank BNK, the lower structure (e.g., the first insulating layer INS1, and the first and second electrodes ELT1 and ELT2) may be prevented or protected from being damaged during the dry-etching process, and residues of the bank BNK may be removed along with formation of the conductive pattern CDP. Therefore, defects resulting from the residues (e.g., a short-circuit defect, or alignment defects of the light emitting elements LD attributable to the residues) may be prevented from being caused.

In an embodiment of the present disclosure, each sub-pixel SPX may form each light emitting device. For example, the first sub-pixel SPX1 corresponding to a red-sub pixel may form a red light emitting device, the second sub-pixel SPX2 corresponding to a green sub-pixel may form a green light emitting device, and the third sub-pixel SPX3 corresponding to a blue sub-pixel may form a blue light emitting device. The full-color pixel PXL including the first, second, and third sub-pixels SPX1, SPX2, and SPX3 may form a full-color light emitting device. In other words, embodiments of the present disclosure are not limited to only a display device, and may be widely applied to other kinds of devices which need light sources.

While the spirit and scope of the present disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the following claims.

The scope of the present disclosure is not limited by detailed descriptions of the present disclosure, and should be defined by the accompanying claims and equivalents thereof. Furthermore, all changes or modifications of the present disclosure derived from the meanings and scope of the claims, and equivalents thereof should be construed as being included in the scope of the present disclosure.

What is claimed is:

1. A display device comprising:
   a substrate;
   a pixel circuit layer on the substrate;
   a first electrode and a second electrode on the pixel circuit layer and spaced from each other;
   a first insulating layer on the pixel circuit layer, the first electrode, and the second electrode;
   a conductive pattern on the first insulating layer and electrically insulated from the first electrode and the second electrode;
   a bank on the conductive pattern; and
   light emitting elements located on the first insulating layer between the first electrode and the second electrode, and electrically coupled to the first electrode and the second electrode,
   wherein a first distance from a portion of the first electrode and the second electrode that is farthest from the substrate is greater than a second distance between a portion of the conductive pattern that is farthest away from the substrate and the substrate.

2. The display device according to claim 1, wherein an angle between a sidewall of the bank and an upper surface of the first insulating layer is in a range of 70° to 90°.

3. The display device according to claim 2, wherein the bank completely overlaps the conductive pattern, and
   wherein the sidewall of the bank is located in a same plane as a sidewall of the conductive pattern.

4. The display device according to claim 3, wherein the bank includes, at a boundary surface thereof bordering the conductive pattern, a concave groove in the sidewall thereof, and
   wherein a portion of the bank that is adjacent to the boundary surface has a reverse tapered shape.

5. The display device according to claim 2, wherein the bank overlaps the conductive pattern, and
   wherein a first width of the bank is greater than a second width of the conductive pattern on a boundary surface between the bank and the conductive pattern.

6. The display device according to claim 1, wherein a portion of the conductive pattern comprising conductive material has been removed by wet-etching.

7. The display device according to claim 6, wherein the conductive pattern comprises transparent conductive material.

8. The display device according to claim 1, wherein the bank comprises light shielding material to block light that is incident from the light emitting elements.

9. The display device according to claim 1, further comprising:
   a first bank pattern interposed between the first electrode and the pixel circuit layer; and
   a second bank pattern interposed between the second electrode and the pixel circuit layer,
   wherein the light emitting elements are located between the first bank pattern and the second bank pattern, and
   wherein a thickness of the bank is greater than a thickness of the first bank pattern.

10. The display device according to claim 9, wherein the conductive pattern does not overlap the first bank pattern and the second bank pattern.

11. The display device according to claim 9, further comprising:
    a first contact electrode located on a first end of the light emitting elements and one area of the first electrode, and configured to electrically connect the first end to the first electrode; and
    a second contact electrode located on a second end of the light emitting elements and one area of the second electrode, and configured to electrically connect the second end to the second electrode.

12. The display device according to claim 11, wherein at least a portion of the conductive pattern, at least a portion of the first contact electrode, and at least a portion of the second contact electrode are located on a same plane.

13. The display device according to claim 12, wherein a thickness of the conductive pattern differs from a thickness of the first contact electrode.

14. The display device according to claim 1, wherein the pixel circuit layer includes a first emission area, a second emission area, and a third emission area that are separated from each other by the bank,
    wherein the light emitting elements comprise a first light emitting element in the first emission area, a second light emitting element in the second emission area, and a third light emitting element in the third emission area, and
    wherein the first light emitting element, the second light emitting element, and the third light emitting element emit different colors of light.

15. A display device comprising:
    a substrate;
    a pixel circuit layer on the substrate;
    a first electrode and a second electrode on the pixel circuit layer and spaced from each other;
    a first insulating layer on the pixel circuit layer, the first electrode, and the second electrode;
    a bank on the first insulating layer;
    a conductive pattern overlapping the bank and electrically insulated from the first electrode and the second electrode; and
    light emitting elements located on the first insulating layer between the first electrode and the second electrode, and electrically coupled to the first electrode and the second electrode, wherein a first distance from a portion of the first electrode and the second electrode that is farthest from the substrate is greater than a second distance between a portion of the conductive pattern that is farthest away from the substrate and the substrate.

16. A method of fabricating a display device, the method comprising:
- forming a first electrode and a second electrode that are spaced from each other on a pixel circuit layer;
- forming a first insulating layer on the pixel circuit layer, the first electrode, and the second electrode;
- forming a light shielding layer on the first insulating layer, the forming the light shielding layer comprising forming a conductive layer on the first insulating layer;
- patterning a mask on the light shielding layer; and
- forming a bank by etching the light shielding layer exposed from the mask,
- wherein forming the bank comprises:
  - dry-etching the light shielding layer exposed from the mask, and
  - wet-etching a portion of the conductive layer that is exposed from the mask, and the mask.

17. The method according to claim 16, wherein forming the light shielding layer on the first insulating layer further comprises:
forming the light shielding layer on the conductive layer.

18. The method according to claim 17, wherein the mask and the conductive layer comprise an identical material.

\* \* \* \* \*